(12) United States Patent
Ching et al.

(10) Patent No.: US 11,004,959 B2
(45) Date of Patent: May 11, 2021

(54) SEMICONDUCTOR DEVICE STRUCTURE AND METHOD FOR FORMING THE SAME

(71) Applicant: Taiwan Semiconductor Manufacturing Co., Ltd., Hsinchu (TW)

(72) Inventors: Kuo-Cheng Ching, Zhubei (TW); Zhi-Chang Lin, Zhubei (TW); Kuan-Ting Pan, Taipei (TW); Chih-Hao Wang, Baoshan Township (TW); Shi-Ning Ju, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/683,512

(22) Filed: Nov. 14, 2019

(65) Prior Publication Data
US 2020/0243666 A1 Jul. 30, 2020

Related U.S. Application Data

(63) Continuation of application No. 16/260,483, filed on Jan. 29, 2019, now Pat. No. 10,825,918.

(51) Int. Cl.
*H01L 29/66* (2006.01)
*H01L 27/088* (2006.01)
(Continued)

(52) U.S. Cl.
CPC .... *H01L 29/6681* (2013.01); *H01L 21/02507* (2013.01); *H01L 21/0337* (2013.01);
(Continued)

(58) Field of Classification Search
CPC ................................................ H01L 29/66545
See application file for complete search history.

(56) References Cited

U.S. PATENT DOCUMENTS 9,209,247 B2   12/2015   Colinge et al.
9,236,267 B2   1/2016    De et al.
(Continued)

FOREIGN PATENT DOCUMENTS

KR   10-2016-0098195 A   8/2016
TW        201735185 A   10/2017

OTHER PUBLICATIONS

U.S. Office Action, dated Mar. 5, 2020, for U.S. Appl. No. 16/260,483.

*Primary Examiner* — Thao P Le
(74) *Attorney, Agent, or Firm* — Birch, Stewart, Kolasch & Birch, LLP

(57) ABSTRACT

A semiconductor device structure is provided. The semiconductor device structure includes an isolation structure formed over a substrate, and a first stacked wire structure and a second stacked wire structure extending above the isolation structure. The semiconductor device structure includes a dummy fin structure formed over the isolation structure, and the dummy fin structure is between the first stacked wire structure and the second stacked wire structure. The semiconductor device structure also includes a capping layer formed over the dummy fin structure. The isolation structure has a first width, the dummy fin structure has a second width, and the second width is smaller than the first width.

20 Claims, 38 Drawing Sheets

(51) Int. Cl.
  *H01L 21/02* (2006.01)
  *H01L 21/768* (2006.01)
  *H01L 29/78* (2006.01)
  *H01L 21/033* (2006.01)
  *H01L 21/8234* (2006.01)

(52) U.S. Cl.
  CPC .. *H01L 21/76832* (2013.01); *H01L 21/76834* (2013.01); *H01L 21/76876* (2013.01); *H01L 21/823431* (2013.01); *H01L 21/823437* (2013.01); *H01L 21/823468* (2013.01); *H01L 21/823481* (2013.01); *H01L 27/0886* (2013.01); *H01L 29/66545* (2013.01); *H01L 29/785* (2013.01)

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 10,825,918 B2 * | 11/2020 | Ching ............... H01L 29/66439 |
| 2013/0037871 A1* | 2/2013 | Sudo .................... H01L 21/762 257/295 |
| 2016/0181398 A1* | 6/2016 | Huang ............ H01L 21/823842 438/585 |
| 2018/0315857 A1 | 11/2018 | Li |
| 2019/0006515 A1* | 1/2019 | Cheng ............... H01L 21/76877 |
| 2019/0067417 A1 | 2/2019 | Ching et al. |
| 2019/0081145 A1 | 3/2019 | Xie et al. |
| 2019/0088553 A1 | 3/2019 | Van Dal et al. |
| 2019/0385898 A1 | 12/2019 | Peng |
| 2019/0385916 A1 | 12/2019 | Song et al. |
| 2020/0243666 A1* | 7/2020 | Ching ............... H01L 29/78696 |

* cited by examiner

SEMICONDUCTOR DEVICE STRUCTURE AND METHOD FOR FORMING THE SAME

CROSS REFERENCE TO RELATED APPLICATIONS

This application is a Continuation application of U.S. patent application Ser. No. 16/260,483, filed on Jan. 29, 2019, the entire of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs.

Although existing semiconductor devices have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
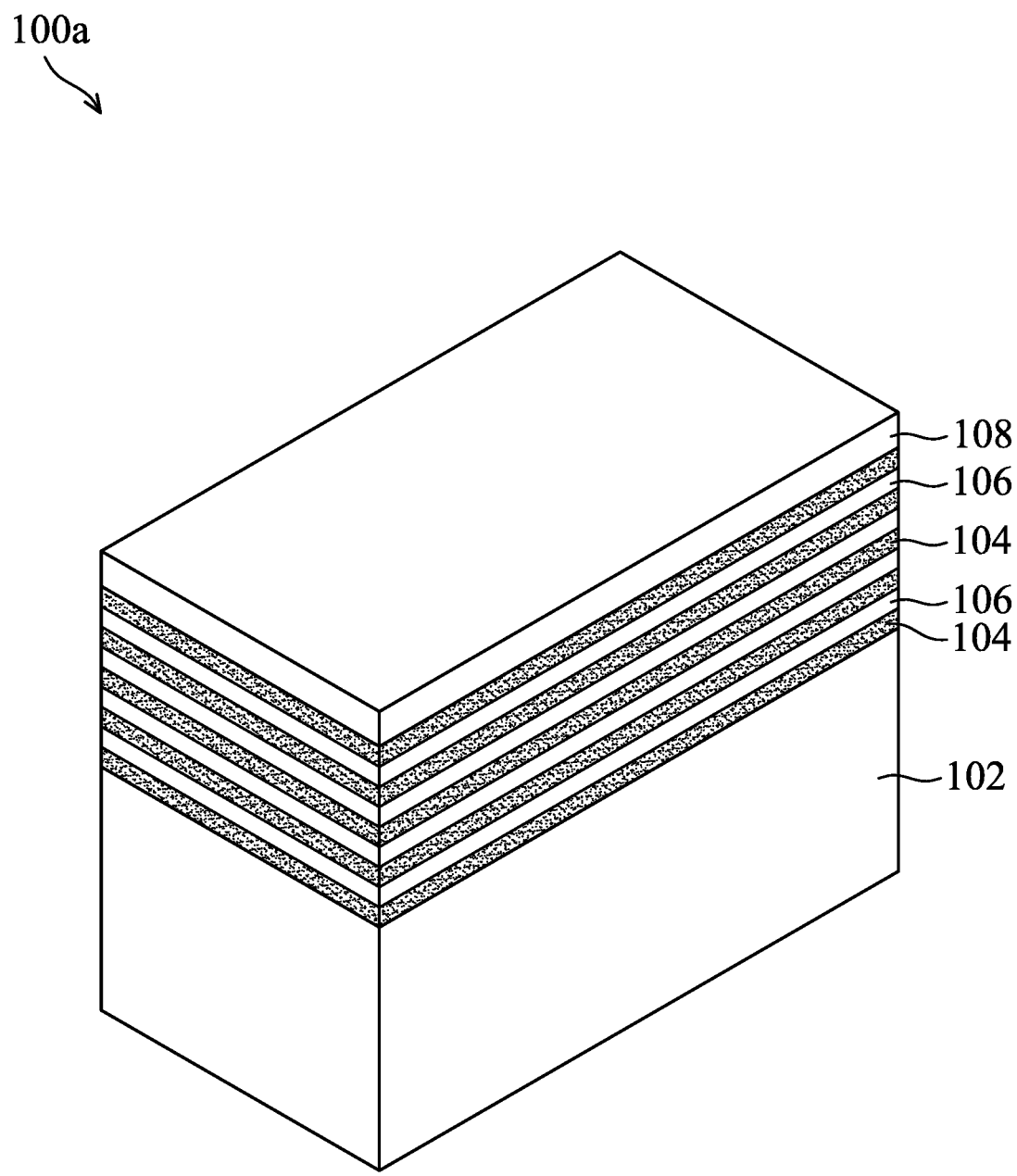
FIGS. 1A-1K show perspective representations of various stages of forming a semiconductor device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments for forming a semiconductor device structure are provided. FIGS. 1A-1K show perspective representations of various stages of forming a semiconductor device structure 100a, in accordance with some embodiments of the disclosure. The semiconductor device structure 100a is a gate all around (GAA) transistor structure. A self-aligned cut metal gate process is provided. A dummy fin structure is formed over an isolation structure, and a capping layer is formed over the dummy fin structure. The dummy fin structure and the capping layer construct a barrier structure to separate two gate structures.

Referring to FIG. 1A, a substrate 102 is provided. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

A number of first semiconductor layers 104 and a number of second semiconductor layers 106 are sequentially alternately formed over the substrate 102. The semiconductor layers 104 and 106 are vertically stacked to form a stacked wire structure.

In some embodiments, the first semiconductor layers 104 and the second semiconductor layers 106 independently include silicon (Si), germanium (Ge), silicon germanium ($Si_{1-x}Ge_x$, 0.1<x<0.7, the value x is the atomic percentage of germanium (Ge) in the silicon germanium), indium arsenide (InAs), indium gallium arsenide (InGaAs), indium antimonide (InSb), or another applicable material. In some embodiments, the first semiconductor layer 104 and the second semiconductor layer 106 are made of different materials.

The first semiconductor layers 104 and the second semiconductor layers 106 are made of different materials having different lattice constant. In some embodiments, the first semiconductor layer 104 is made of silicon germanium ($Si_{1-x}Ge_x$, 0.1<x<0.7), and the second semiconductor layer 106 is made of silicon (Si). In some other embodiments, the first semiconductor layer 104 is made of silicon germanium ($Si_{1-x}Ge_x$, 0.1<x<0.7), and the second semiconductor layer 106 is made of germanium (Ge).

In some embodiments, the first semiconductor layers 104 and the second semiconductor layers 106 are formed by a selective epitaxial growth (SEG) process, a chemical vapor deposition (CVD) process (e.g. low-pressure CVD (LPCVD), plasma enhanced CVD (PECVD)), a molecular epitaxy process, or another applicable process. In some embodiments, the first semiconductor layers 104 and the second semiconductor layers 106 are formed in-situ in the same chamber.

In some embodiments, the thickness of each of the first semiconductor layers 104 is in a range from about 1.5 nanometers (nm) to about 20 nm. Terms such as "about" in conjunction with a specific distance or size are to be interpreted as not to exclude insignificant deviation from the specified distance or size and may include for example deviations of up to 20%. In some embodiments, the first semiconductor layers 104 are substantially uniform in thickness. In some embodiments, the thickness of each of the second semiconductor layers 106 is in a range from about 1.5 nm to about 20 nm. In some embodiments, the second semiconductor layers 106 are substantially uniform in thickness.

Next, a number of first hard mask layers 108 are formed over the first semiconductor layers 104. In some embodiments, each of the first hard mask layer 108 is made of silicon nitride, silicon carbon nitride (SiCN), or applicable material. In some embodiments, the first hard mask layers 108 are formed by a deposition process, such as low-pressure CVD (LPCVD) process, plasma enhanced CVD (PECVD) process, or another deposition process.

Figure 1B:
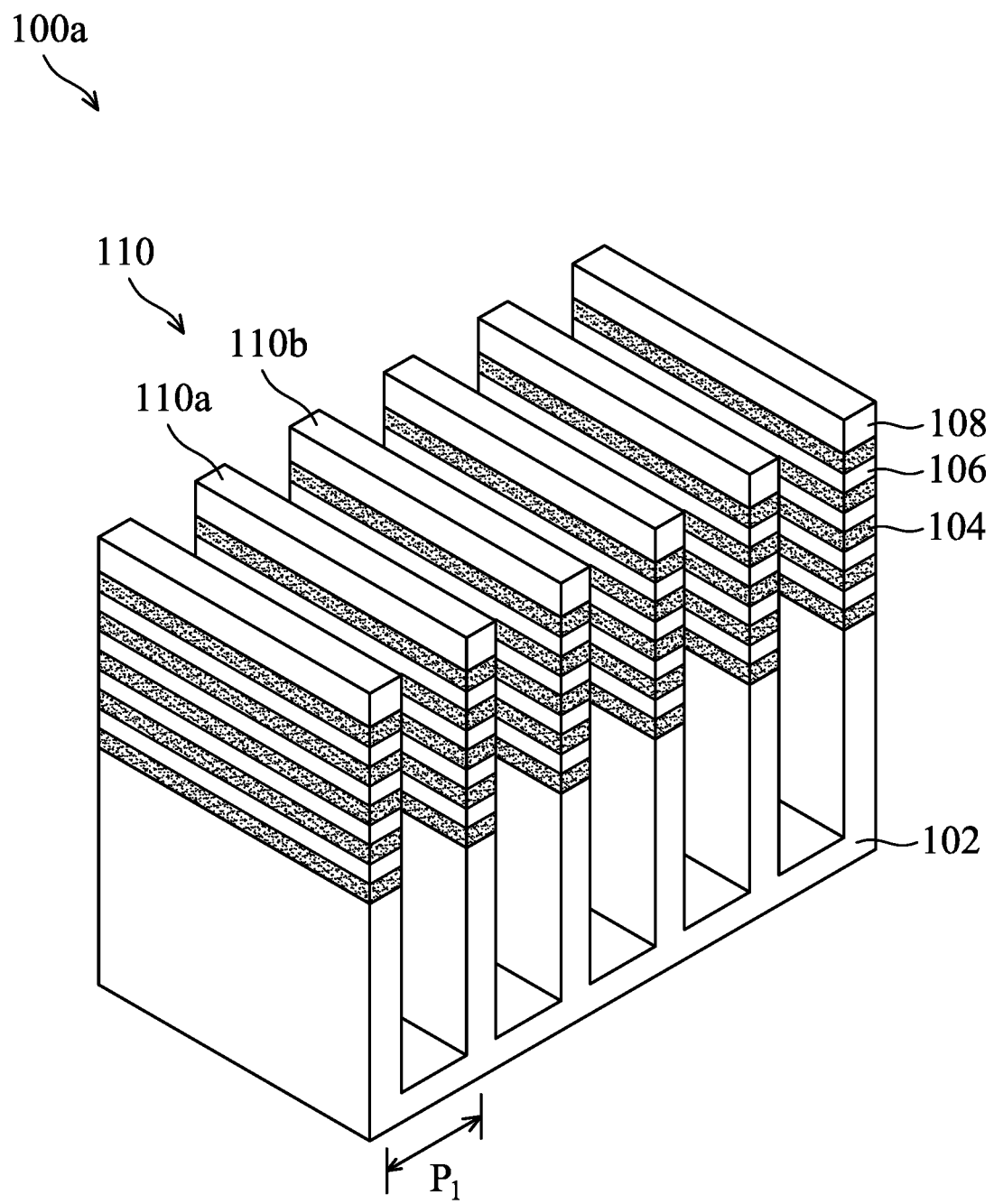

Next, as shown in FIG. 1B, a number of fin structures 110 are formed, in accordance with some embodiments. The fin structures 110 include a first fin structure 110a and a second fin structure 110b.

The first hard mask layer 108 is patterned firstly. Then, the first semiconductor layers 104 and the second semiconductor layers 106 are patterned by using the patterned hard mask layer 108 as a mask. The fin structures 110 are formed by performing a patterning process on the first semiconductor layers 104 and the second semiconductor layers 106. The patterning process includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process includes a dry etching process or a wet etching process.

As shown in FIG. 1B, there is a first pitch $P_1$ between two adjacent fin structures 110. In some embodiments, the first pitch $P_1$ is in a range from about 20 nm to about 50 nm.

Figure 1C:
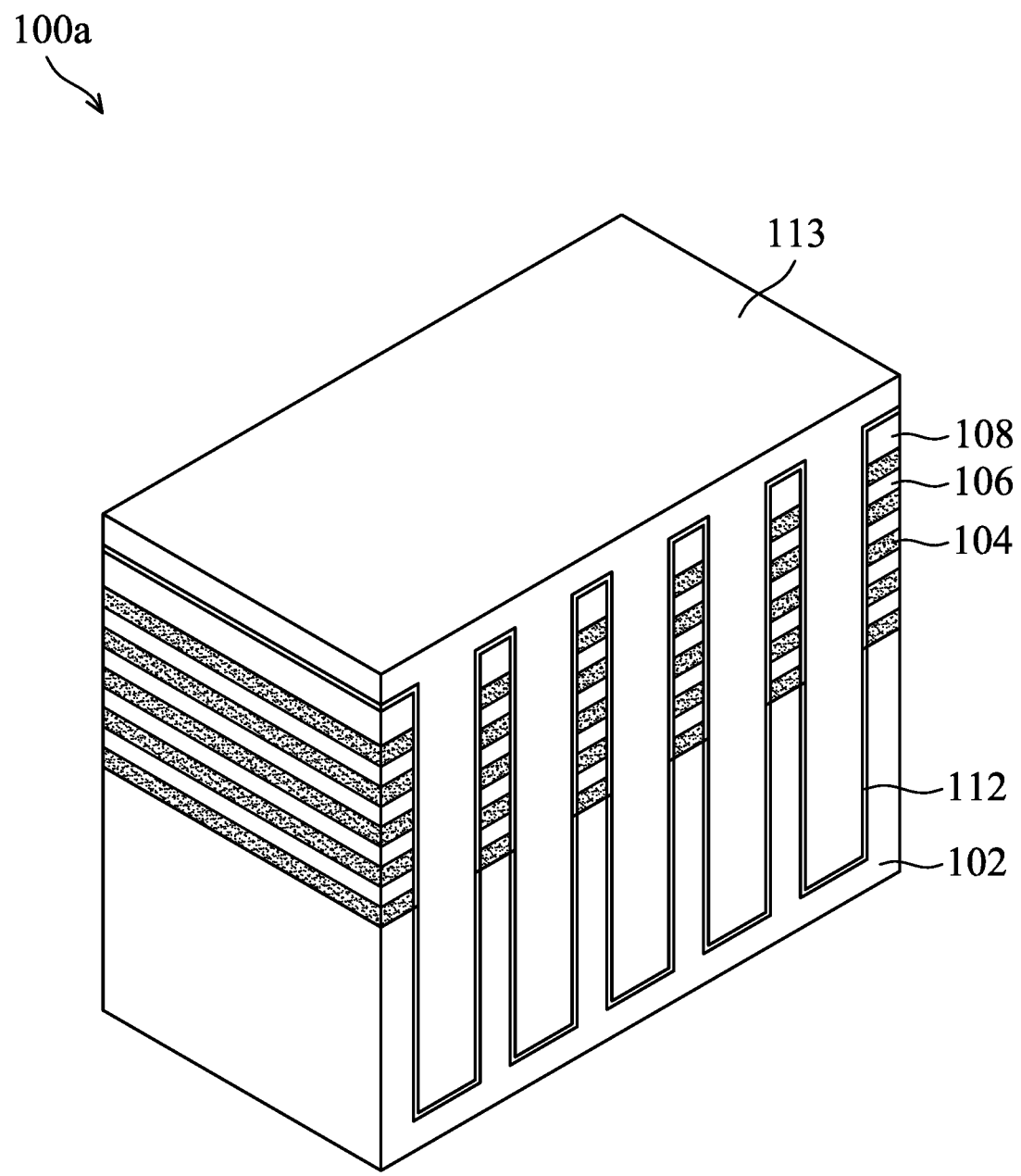

Next, as shown in FIG. 1C, a seed layer 112 is formed on the sidewall surface of the first fin structure 110a, the sidewall surface of the second fin structure 110b, and over the first hard mask layer 108, in accordance with some embodiments. Afterwards, an insulating material 113 is formed over the substrate 102 and over the fin structures 110.

The seed layer 112 is made of silicon, silicon oxide, silicon nitride, or a combination thereof. In some embodiment, the seed layer 112 includes a bilayer structure, such as a silicon layer and a silicon oxide layer formed on the silicon layer. In some embodiments, the seed layer 112 is formed by using a thermal oxidation process, chemical vapor deposition (CVD) process, atomic layer deposition (ALD) process, another suitable process, or a combination thereof.

In some embodiments, the insulating material 113 is made of silicon oxide, silicon nitride, silicon oxynitride (SiON), another applicable insulating material, or a combination thereof. In some embodiments, the insulating material 113 is formed by a LPCVD process, plasma enhanced CVD (PECVD) process, high density plasma CVD (HDP-CVD) process, high aspect ratio process (HARP) process, flowable CVD (FCVD) process, atomic layer deposition (ALD) process, another suitable method, or a combination thereof.

Figure 1D:
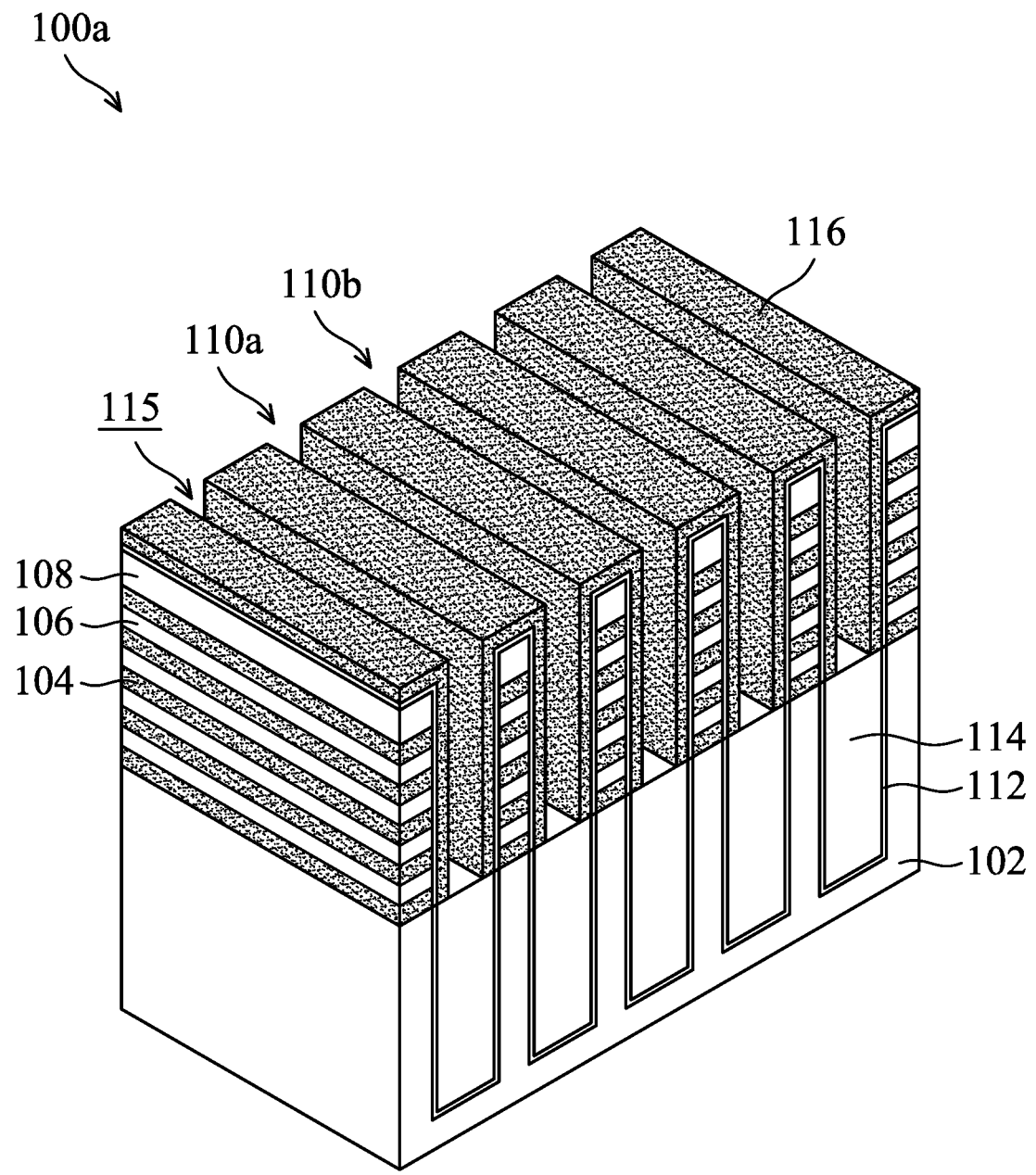

Next, as shown in FIG. 1D, a portion of the insulating material 113 is removed to form an isolation structure 114, in accordance with some embodiments. As a result, top portions of the fin structures 110 are above the isolation structure 114. There is a trench 115 is between two adjacent fin structures 110. The first fin structure 110a and the second fin structure 110b are extended above the isolation structure 114.

Afterwards, a first liner 116 is formed on the sidewall surface of the first fin structure 110a, the sidewall surface of the second fin structure 110b and the sidewall surface and the top surface of the first hard mask layer 108. It should be noted that the first liner 116 is selectively formed on the seed layer 112, and not formed on the isolation structure 114. In some embodiments, the seed layer 112 is made of silicon, and the first liner 116 is made of silicon germanium (SiGe). The trench 115 is not completely filled with the first liner 116. More specifically, the first liners 116 are formed on opposite sidewall surfaces of the trench 115.

Figure 1E:
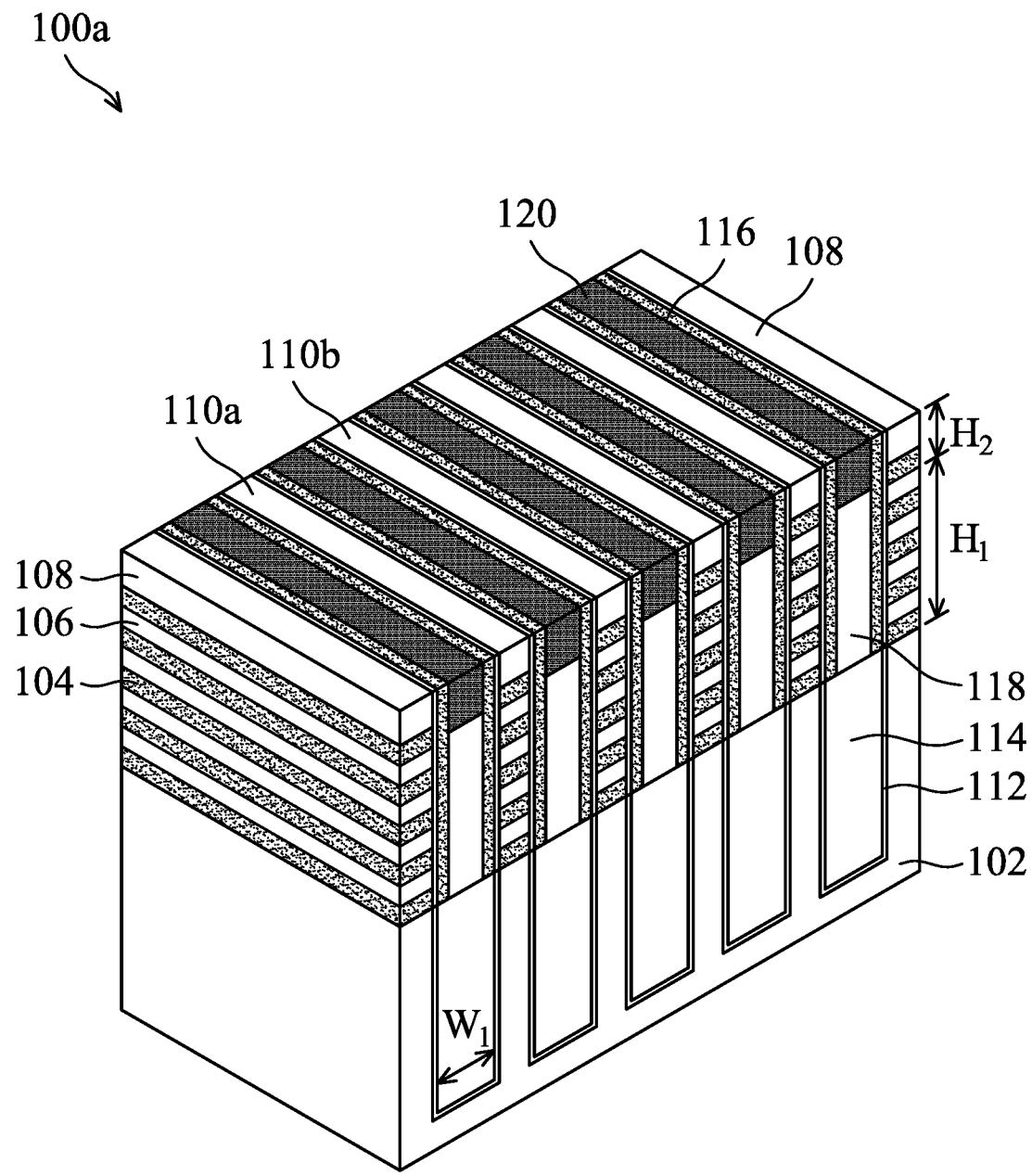

Next, as shown in FIG. 1E, a dummy fin structure 118 is formed in the trench 115, in accordance with some embodiments. In some embodiments, the dummy fin structure 118 and the isolation structure 114 are made of different materials, and therefore an interface is between the dummy fin structure 118 and the isolation structure 114. The first liner 116 is between the dummy fin structure 118 and the first fin structure 110a.

A dummy fin material is formed over the isolation structure 114, the fin structure 110, the first liner 116 and the first hard mask layer 108, and then a portion of the dummy fin material is removed to form the dummy fin structure 118. The dummy fin structure 118 is formed over the isolation structure 114 and is surrounded by the first liner 116. The dummy fin structure 118 is formed between the first fin structure 110a and the second fin structure 110b. In some embodiments, the portion of the dummy fin material is removed by a removal process, such as an etch-back process, chemical mechanical polishing (CMP), or a combination thereof.

After the portion of the dummy fin material is removed, a recess (not shown) is formed over the top surface of the dummy fin structure 118. Next, a capping layer 120 is formed over the dummy fin structure 118, the first liner 116, and the first hard mask layer 108. Next, a portion of the capping layer 120 is removed to expose the top surface of the first hard mask layer 108, and the top surface of the first liner 116. In some embodiments, the portion of the capping layer 120 is removed by a planarizing process, such as chemical mechanical polishing (CMP) process.

In some embodiments, the dummy fin structure 118 is made of low-k dielectric material with k value smaller than 7 (<7), such as silicon oxide, silicon nitride, silicon oxynitride (SiON), silicon carbon oxynitride (SiCON), another applicable insulating material, or a combination thereof. In some embodiments, the dummy fin structure 118 is formed by a LPCVD process, plasma enhanced CVD (PECVD) process, high density plasma CVD (HDP-CVD) process, high aspect ratio process (HARP) process, flowable CVD (FCVD) process, atomic layer deposition (ALD) process, another suitable method, or a combination thereof.

In some embodiments, the capping layer 120 is made of a high-k dielectric material with a K value greater than 7 (>7). The high-k dielectric material may include hafnium oxide (HfO$_2$), zirconium oxide (ZrO$_2$), aluminum oxide (Al$_2$O$_3$), hafnium alumina oxide (HfAlOx), hafnium silicon oxide (HfSiOx), hafnium silicon oxynitride, hafnium tantalum oxide (HfTaOx), hafnium titanium oxide (HfTiOx), hafnium zirconium oxide (HfZrOx), or the like. In some embodiments, the capping layer 120 is formed by a LPCVD process, plasma enhanced CVD (PECVD) process, high density plasma CVD (HDP-CVD) process, high aspect ratio process (HARP) process, flowable CVD (FCVD) process, atomic layer deposition (ALD) process, another suitable method, or a combination thereof.

As shown in FIG. 1E, the isolation structure 114 has a first width $W_1$ in a horizontal direction, the dummy fin structure 118 has a second with $W_2$ in the horizontal direction. The second width $W_2$ is smaller than the first width $W_1$. In some embodiments, the dummy fin structure 118 has a first height $H_1$ in a vertical direction. The capping layer 120 has a second height $H_2$ measured in a vertical direction. In some embodiments, the second height $H_2$ is in a range from about 10 nm to about 30 nm. In some embodiments, a ratio of the second height $H_2$ to the first height $H_1$ is in a range from about 0.1 to about 0.7.

Figure 1F:
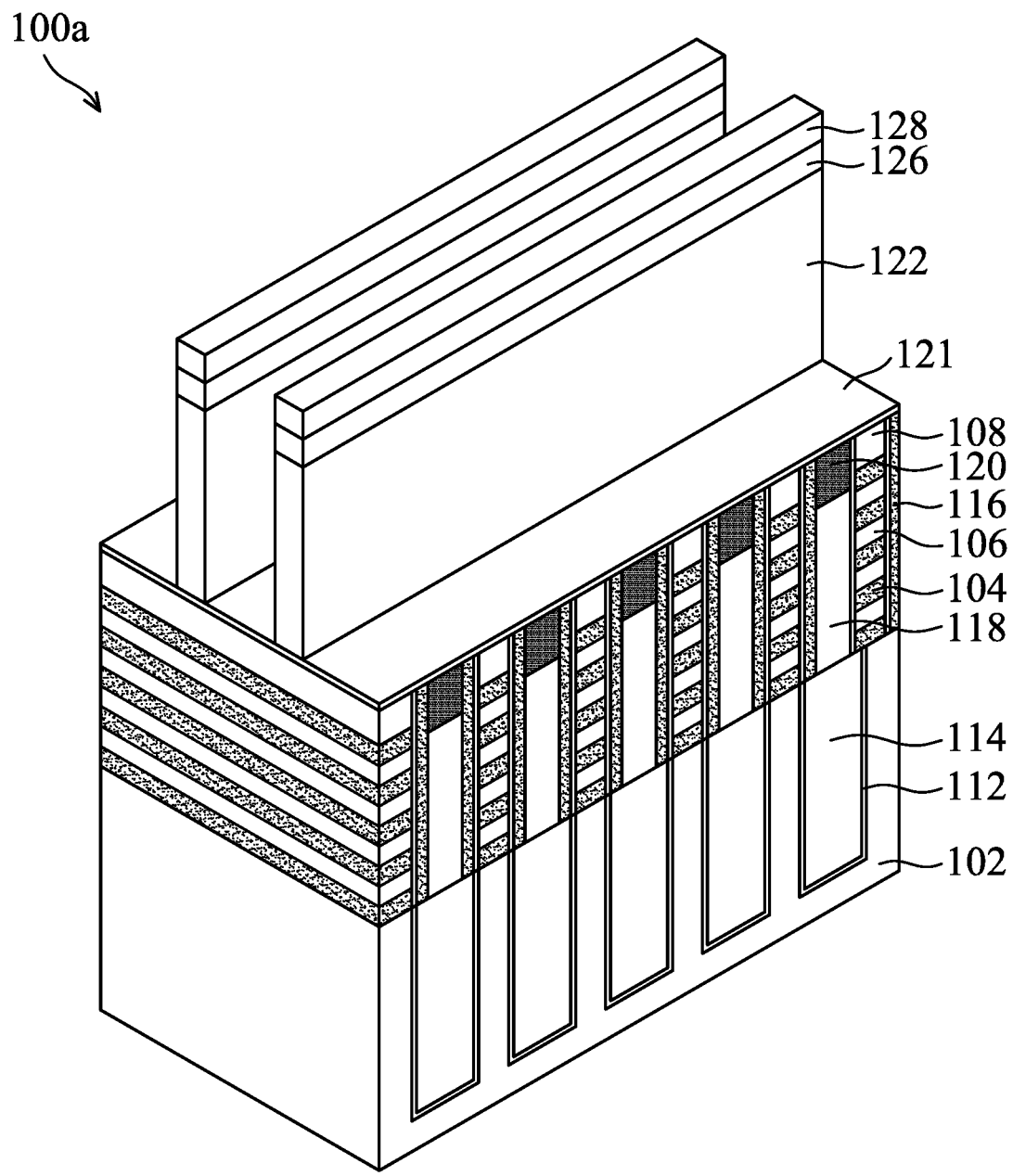

Next, as shown in FIG. 1F, an etching stop layer 121 is formed over the capping layer 120, the first hard mask layer 108 and the first liner 116, in accordance with some embodiments. The top surface of the capping layer 120, the top surface of the first mask layer 108 and the top surface of the first liner 116 form a substantially planar top surface. Therefore, the etching stop layer 121 is formed over the substantially planar top surface. As used herein, a structure is "substantially planar" if the deviation of the structure from a plane is within the statistical atomic level variations inherent within semiconductor processing methods known in the art.

Afterwards, a dummy gate structure 122 is formed over the etching stop layer 121. A second mask layer 126 is formed over the dummy gate structure 122, and a third mask layer 128 is formed over the second mask layer 126.

In some embodiments, the etching stop layer 121 is made of silicon oxide. The etching stop layer 121 is formed by a deposition process, such as CVD (such as PECVD, HARP, or a combination thereof) process, ALD process, another applicable process, or a combination thereof. In some embodiments, the dummy gate structure 122 is made of polycrystalline-silicon (poly-Si) or poly-crystalline silicon-germanium (poly-SiGe). The dummy gate structure 122 is formed by a deposition process and a patterning process by using the second mask layer 126 and the third mask layer 128 as masks.

In some embodiments, the second hard mask layer 126 and the third mask layer 128 are independently made of silicon oxide, silicon nitride, silicon carbon nitride (SiCN), or applicable material. In some embodiments, the second hard mask layer 126 and the third mask layer 128 are independently formed by a deposition process, such as CVD process, ALD process, another applicable process, or a combination thereof.

Figure 1G:
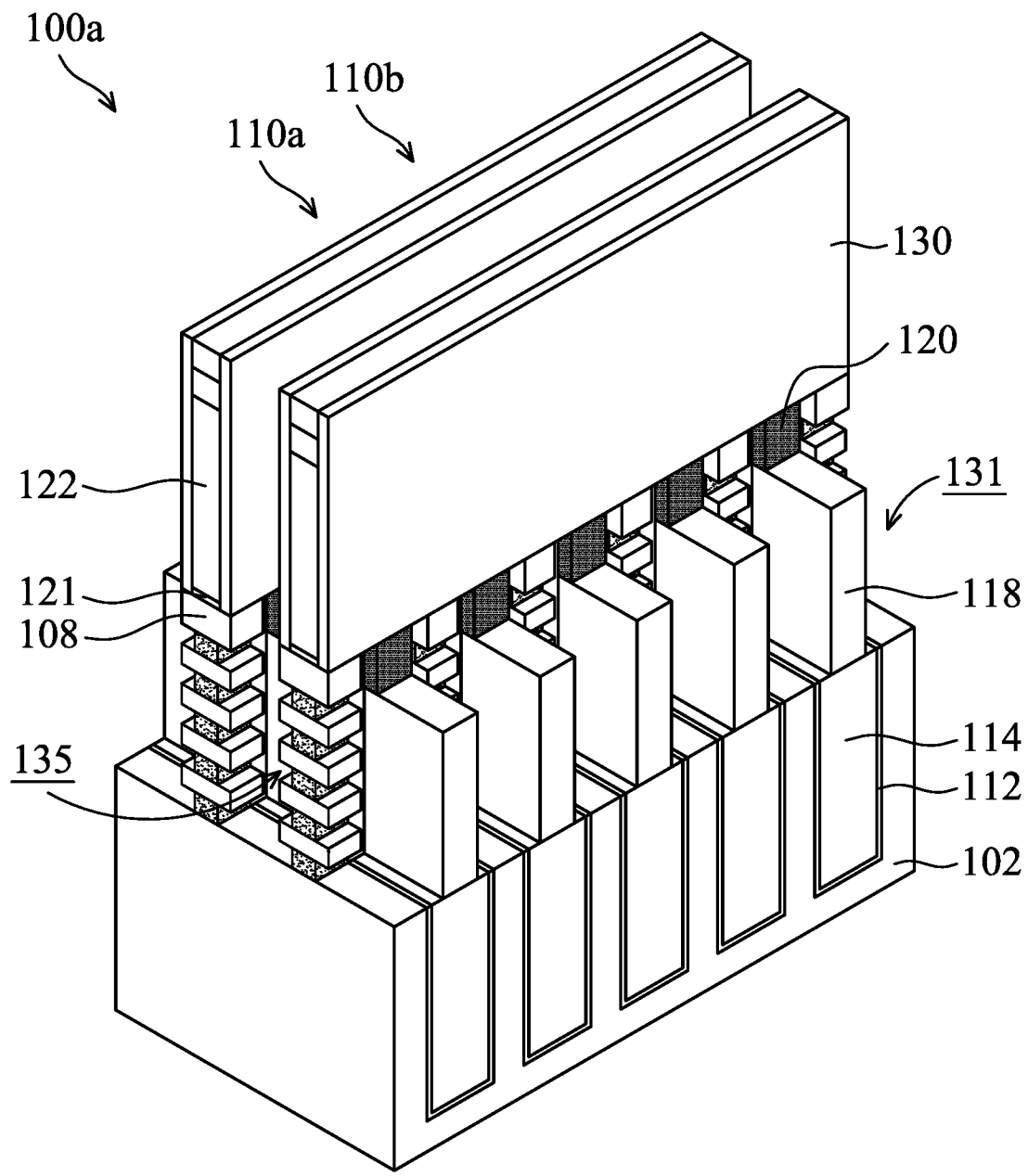

Next, as shown in FIG. 1G, a gate spacer layer 130 is formed on opposite sidewall surfaces of the dummy gate structure 122, in accordance with some embodiments.

In some embodiments, the gate spacer layer 130 is made of a dielectric material, such as silicon oxide (SiO$_2$), silicon nitride (SiN), silicon carbide (SiC), silicon oxynitride (SiON), silicon carbon nitride (SiCN), silicon oxide carbonitride (SiOCN), or a combination thereof. In some embodiments, the gate spacer layer 130 is formed by a deposition process, such as CVD process, ALD process, another applicable process, or a combination thereof.

Next, some regions not covered by the dummy gate structure 122 are removed. More specifically, a portion of the etching stop layer 121, a portion of the capping layer 120, a portion of the first liner 116, and a portion of the fin structure 110 are removed to form a number of S/D recesses 131. Next, a portion of the first liner 116 and a portion of the first semiconductor layers 104 below the dummy gate structure 122 are removed to form a cavity 135.

It should be noted that the capping layer 120 is made of high-k dielectric material, and the dummy fin structure 118 is made of low-k dielectric material. In some embodiments, the capping layer is made of the high-k dielectric material with k value greater than 7 (>7), and the dummy fin structure 118 is made of low-k dielectric material with k value smaller than 7 (<7). The capping layer 120 and the dummy fin structure 118 are made of different material to have different etching rates. The capping layer 120 not covered by the dummy gate structure 122 is removed, but the dummy fin structure 118 directly below the removed capping layer 120 is left since the etching selectively of the capping layer 120 to the dummy fin structure 118 is high. Furthermore, since the portion of the first liner 116 is removed, a portion of the isolation structure 114 is exposed by the S/D recesses 131.

Figure 1H:
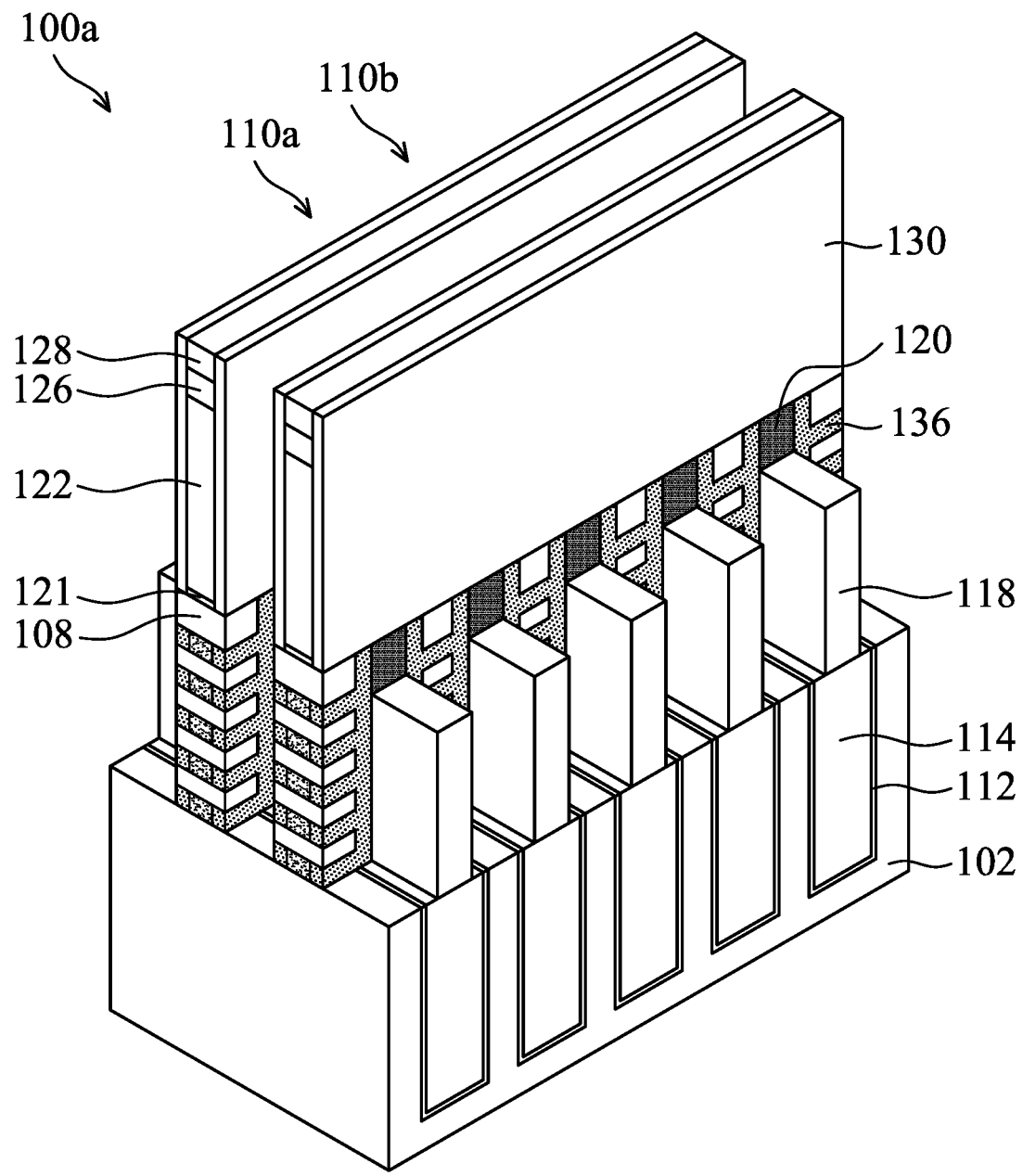

Next, as shown in FIG. 1H, an inner spacer layer 136 is formed in the cavity 135, in accordance with some embodiments. The inner spacer layer 136 is configured to as a barrier between an S/D structure 138 (formed later, FIG. 1I) and a gate structure 160a (formed later, as shown in FIG. 2E). The inner spacer layer 136 can reduce the parasitic capacitance between the S/D structure 138 (formed later, FIG. 1I) and the gate structure 160a (formed later, as shown in FIG. 2E).

The inner spacer layer 136 is directly below the gate spacer layer 130. The inner spacer layer 136 is formed on the sidewall surface of the first fin structure 110a and the sidewall surface of the second fin structure 110b. In addition, the inner spacer layer 136 is formed on the sidewall surface of the capping layer 120.

In some embodiments, the inner spacer layer 136 is made of silicon carbon nitride (SiCN), silicon oxide carbonitride (SiOCN), or a combination thereof. In some embodiments, the inner spacer layer 136 is formed by a deposition process, such as CVD process, ALD process, another applicable process, or a combination thereof.

Figure 1I:
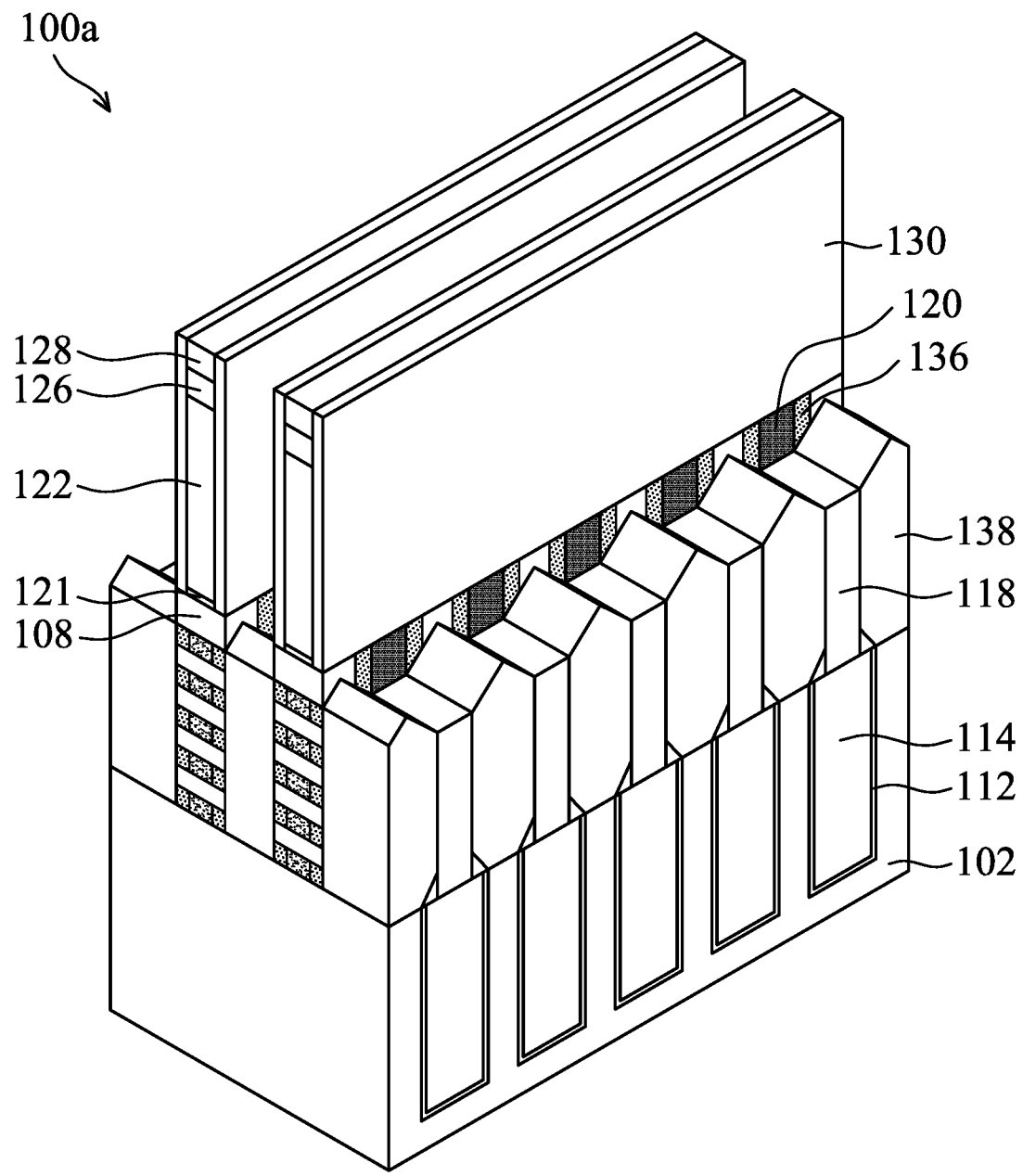

Next, as shown in FIG. 1I, a number of S/D structures 138 are formed in the S/D recesses 131, in accordance with some embodiments.

Each of the S/D structures 138 may include silicon germanium (SiGe), indium arsenide (InAs), indium gallium arsenide (InGaAs), indium antimonide (InSb), germanium arsenide (GaAs), germanium antimonide (GaSb), indium aluminum phosphide (InAlP), indium phosphide (InP), or a combination thereof. The S/D structures 138 may be doped with one or more dopants. In some embodiments, the S/D structures 138 are silicon (Si) doped with phosphorus (P), arsenic (As), antimony (Sb), or another applicable dopant. Alternatively, one of the S/D structures 138 is silicon germanium (SiGe) doped with boron (B) or another applicable dopant.

In some embodiments, the S/D structures 138 are formed by an epitaxy or epitaxial (epi) process. The epi process may include a selective epitaxial growth (SEG) process, CVD deposition techniques (e.g., vapor-phase epitaxy (VPE) and/or ultra-high vacuum CVD (UHV-CVD)), molecular beam epitaxy, or other suitable epi processes.

Figure 1J:
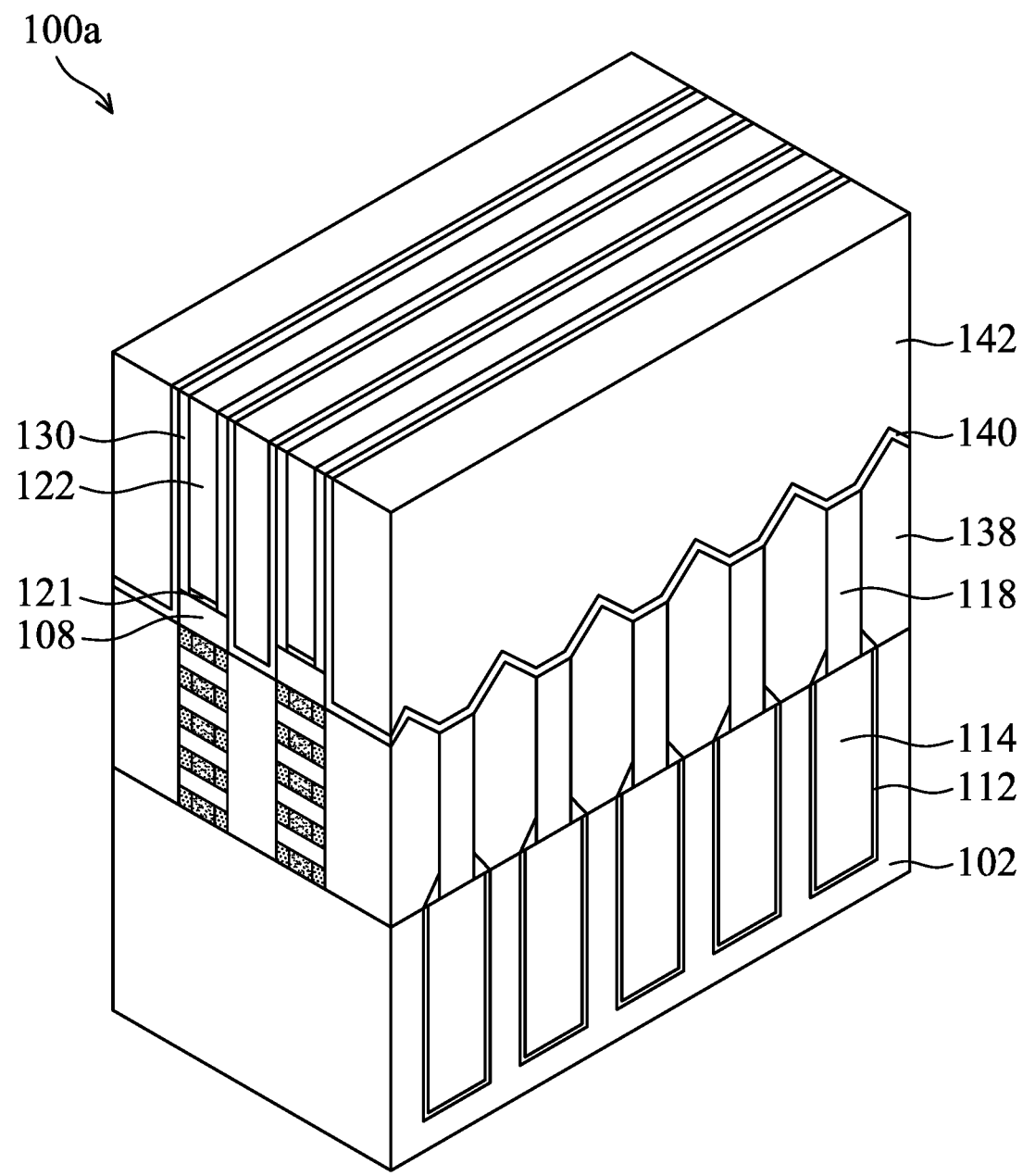

Next, as shown in FIG. 1J, a contact etch stop layer (CESL) 140 is formed over the S/D structures 138, and an inter-layer dielectric (ILD) layer 142 is formed over the CESL 140, in accordance with some embodiments. The CESL 140 is between the S/D structures 138 and the ILD layer 142. Next, a portion of the ILD layer 142 is removed to expose the top surface of the dummy gate structure 122. In some embodiments, the portion of the ILD layer 142 is removed by a planarizing process, a chemical mechanical polishing (CMP) process.

In some embodiments, the CESL 140 is made of silicon nitride, silicon oxynitride, and/or other applicable materials. The CESL 140 may be formed by plasma enhanced chemical vapor deposition (CVD) process, low pressure CVD process, atomic layer deposition (ALD) process, or another applicable processes.

The ILD layer 142 may include multilayers made of multiple dielectric materials, such as silicon oxide, silicon nitride, silicon oxynitride, phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 142 may be formed by chemical vapor deposition (CVD), physical vapor deposition, (PVD), atomic layer deposition (ALD), spin-on coating, or other applicable processes.

Figure 1K:
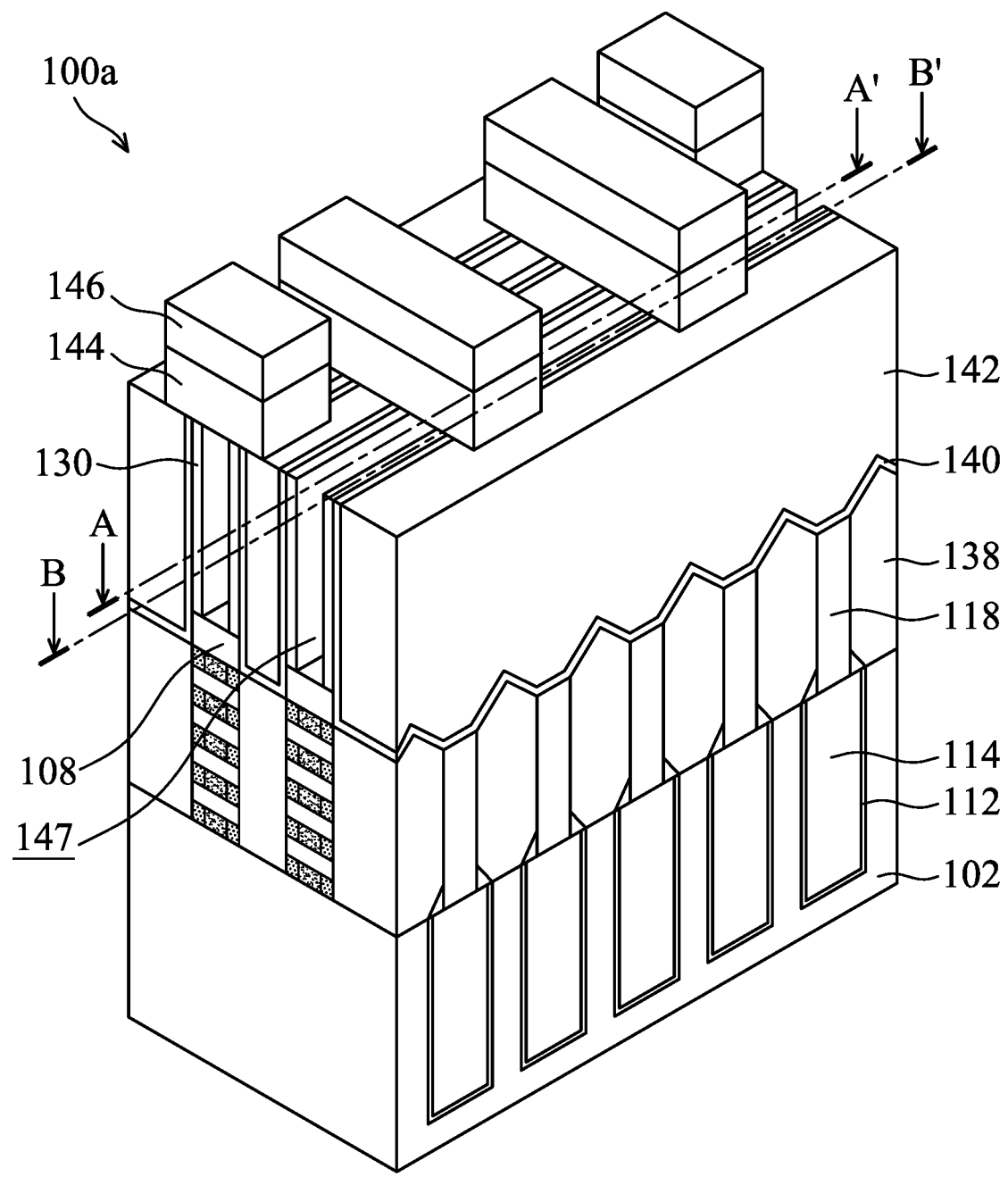

Next, as shown in FIG. 1K, the dummy gate structure 122 and the etching stop layer 121 are removed, in accordance with some embodiments. As a result, a trench 147 is formed to expose the first hard mask layer 108.

Next, a fourth mask layer 144 and a fifth mask layer 146 are formed in the trench 147 and over and the ILD layer 142. The fourth mask layer 144 and the fifth mask layer 146 are independently made of silicon oxide, silicon nitride, silicon carbon nitride (SiCN), or applicable material. In some embodiments, the fourth mask layer 144 and the fifth mask layer 146 are independently formed by a deposition process, such as CVD process, ALD process, another applicable process, or a combination thereof.

Figure 2A:
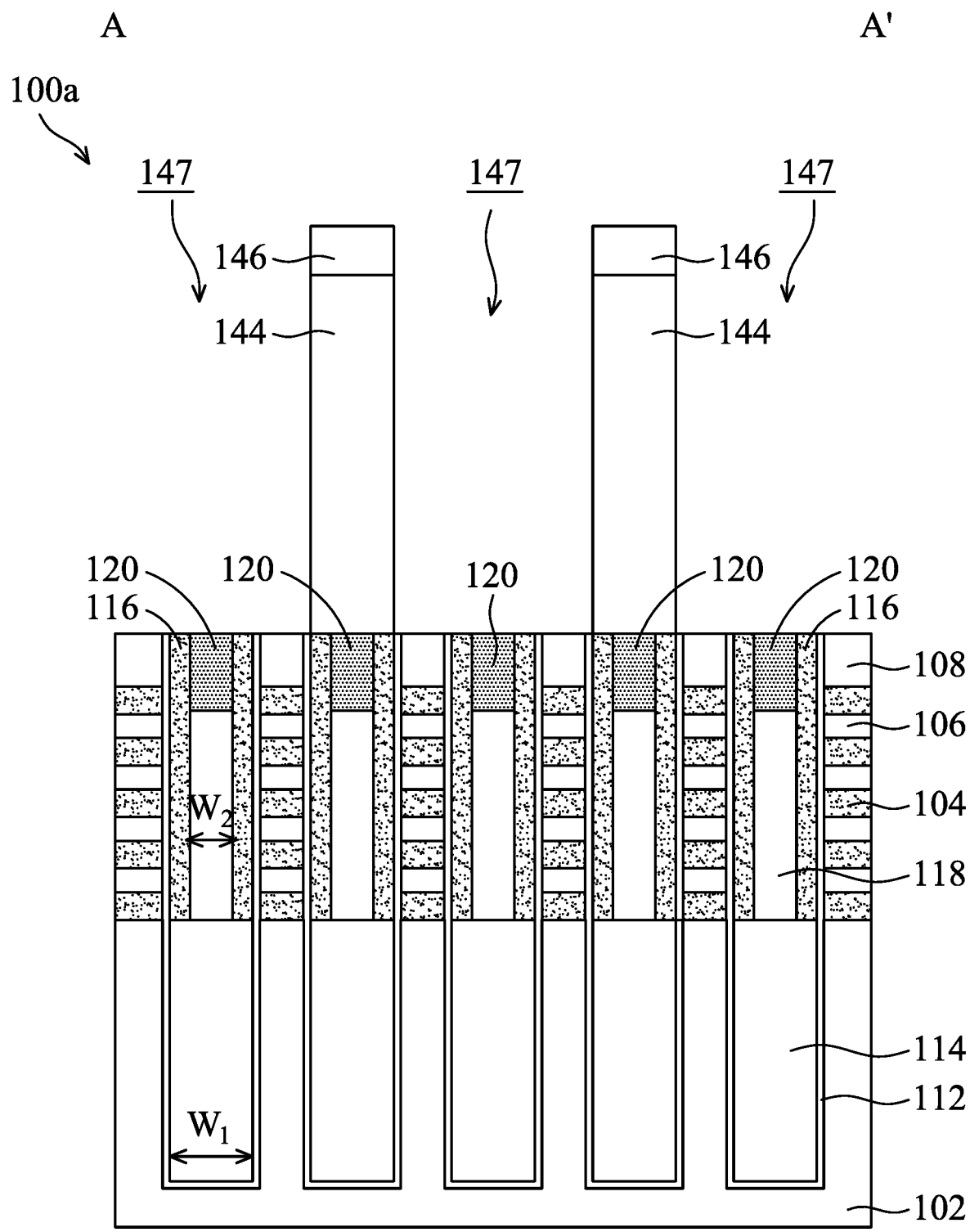
FIGS. 2A-2E show cross-sectional representations of various stages of forming the semiconductor device structure after FIG. 1K, in accordance with some embodiments of the disclosure.
Figure 2B:
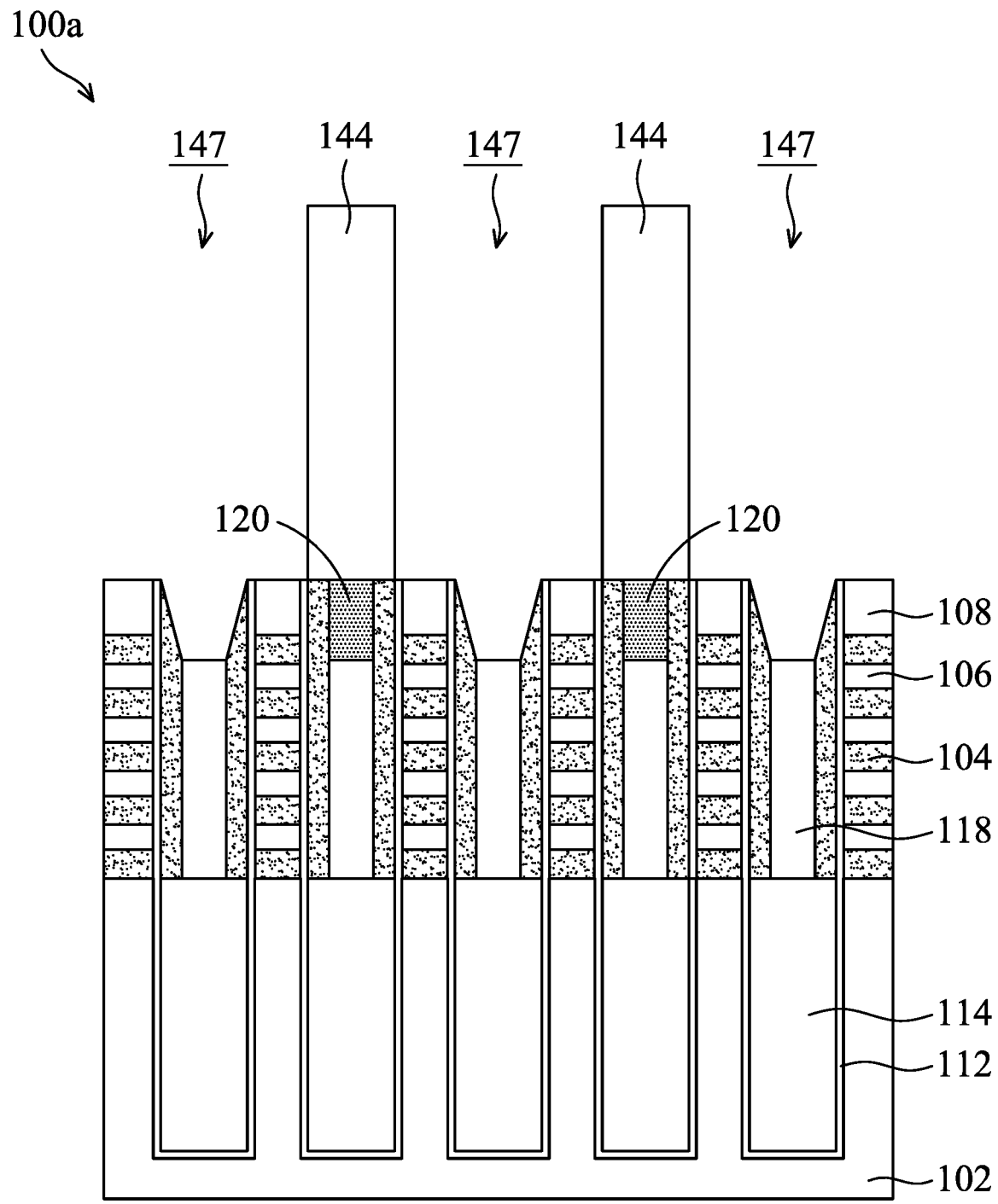
Figure 2C:
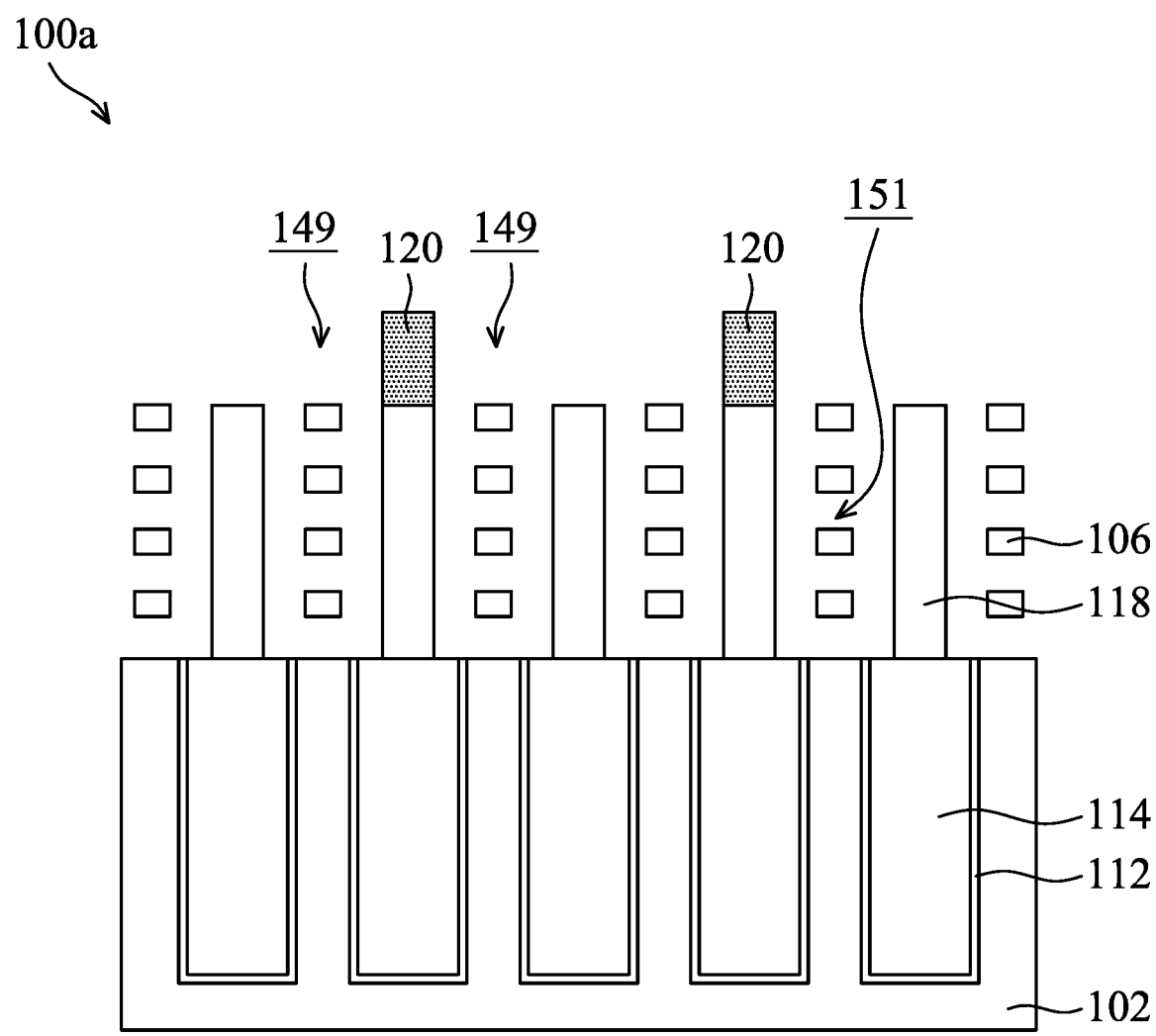
Figure 2D:
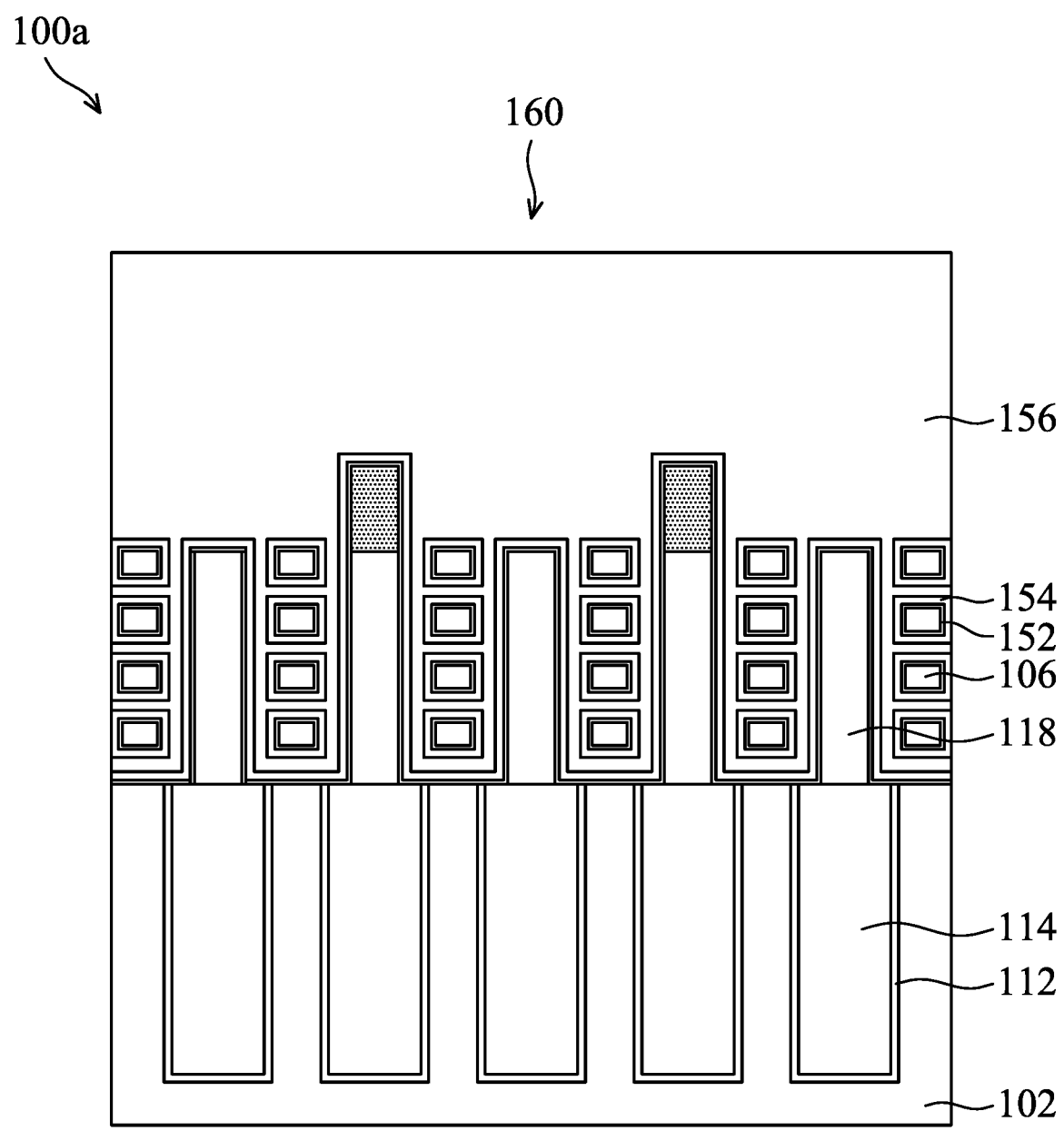
Figure 2E:
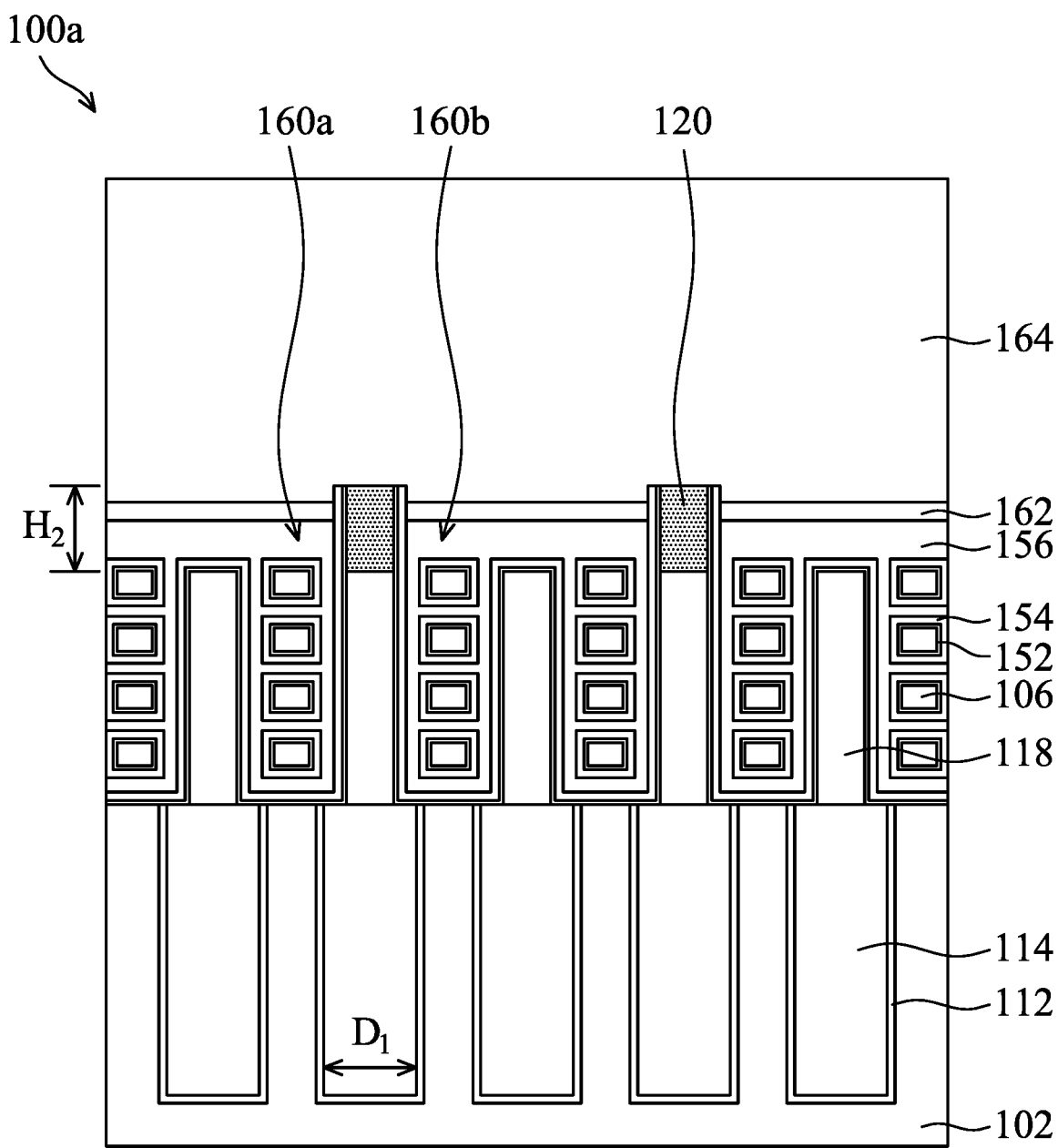

FIGS. 2A-2E show cross-sectional representations of various stages of forming the semiconductor device structure 100a after FIG. 1K, in accordance with some embodiments of the disclosure. FIG. 2A shows a cross-sectional representation of the semiconductor device structure along line AA' shown in FIG. 1K, in accordance with some embodiments.

As shown in FIG. 2A, a number of dummy fin structures 118 are formed over the isolation structure 114, and a number of capping layer 120 are formed over the dummy fin structures 118. The fourth mask layer 144 formed over the capping layer 120 is configured to protect the capping layer 120 from being removed.

Subsequently, as shown in FIG. 2B, some capping layers 120 are removed by the removal process, but some capping layers 120 are protected by the fourth mask layer 144, in accordance with some embodiments. The removal process may be a wet etching process or a dry etching process. The capping layers 120 are surrounded by the first liners 116. During the removal process, a portion of the first liners 116 is removed. Afterwards, the fifth mask layer 146 is removed.

Next, as shown in FIG. 2C, the fourth mask layer 144 is removed, and the first hard mask layer 108 is removed, in accordance with some embodiments. Next, the first liners 116 are removed to form recess 149, and the first semiconductor layers 104 are removed to form gaps 151. As a result, a number of stacked wire structures made of the first semiconductor layers 104 are obtained.

In some embodiments, the fourth mask layer 144 is removed by an ashing process. In some embodiments, the first hard mask layer 108, the first liners 116 and the first semiconductor layers 104 are independently removed by an etching process, such as a wet etching process, a dry etching process, or a combination thereof. In some embodiments, the first liners 116 are made of silicon germanium (SiGe), and the first semiconductor layers 104 are made of silicon germanium (SiGe), and therefore the first liners 116 and the first semiconductor layers 104 are removed simultaneously.

Next, as shown in FIG. 2D, a gate structure 160 is formed in the recess 149 and the gap 151, in accordance with some embodiments. The gate structure 160 includes an interfacial layer 152, a gate dielectric layer 154 and a gate electrode layer 156.

The interfacial layer 152 is conformally formed along the main surfaces of the second semiconductor layers 106 to surround the second semiconductor layers 106. In some embodiments, the interfacial layer 152 is made of a chemically formed silicon oxide.

In some embodiments, the gate dielectric layer 154 is a high-k dielectric layer. In some embodiments, the high-k gate dielectric layer is made of one or more layers of a dielectric material, such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, another suitable high-k dielectric material, or a combination thereof. In some embodiments, the high-k gate dielectric layer 154 is formed using CVD, ALD, another suitable method, or a combination thereof.

The gate electrode layer 156 is formed on the gate dielectric layer 154, in accordance with some embodiments. The gate electrode layer 156 fills the gaps 151. In some embodiments, the gate electrode layer 156 is made of one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another suitable material, or a combination thereof. In some embodiments, the gate electrode layer 156 is formed using CVD, ALD, electroplating, another suitable method, or a combination thereof.

Next, as shown in FIG. 2E, a portion of the gate electrode layer 156 is removed, in accordance with some embodiments. In some embodiments, the portion of the gate electrode layer 156 is removed by a planarizing process, such as chemical mechanical polishing (CMP) process. Afterwards, the gate electrode layer 156 is etched back by an etching process, and therefore the capping layer 120 protrudes above the top surface of the gate electrode layer 156. More specifically, the protruded capping layer 120 is used to cut the gate electrode layer 156, and therefore a first gate structure 160a and a second gate structure 160b are formed. The first gate structure 160a and the second gate structure 160b are separated by the dummy fin structure 118 and the capping layer 120. The first gate structure 160a and the second gate structure 160b each perform different functions.

The top surface of the capping layer 120 is higher than the top surface of the first fin structure 110a and the second fin structure 110b. More specifically, the top surface of the capping layer 120 is higher than the top surface of each of the first semiconductor layers 104. The top surface of the capping layer 120 is higher than the top surface of the first gate structure 160a and the top surface of the second gate structure 160b.

Afterwards, a conductive layer 162 is selectively formed over the gate electrode layer 156, and a sacrificial layer 164 is formed over the conductive layer 162. The conductive layer 162 is used to reduce the resistance of the gate electrode layer 156. In some embodiments, the conductive layer 162 is made of tungsten (W). It should be noted that the conductive layer 162 is selectively formed over the gate electrode layer 156, but not formed over the capping layer 120. In some embodiments, the sacrificial layer 164 is made of silicon nitride, silicon oxynitride (SiON), silicon carbide (SiC), another applicable insulating material, or a combination thereof.

In some embodiments, a surface treatment process is performed on the top surface of the gate electrode layer 156 to form some hydrogen radicals, and then a deposition process with a precursor is performed on the treated top surface of the gate electrode layer 156 to form the conductive layer 162. In some embodiments, the surface treatment process includes using hydrogen ($H_2$) gas. The precursor may include tungsten (W)-containing material, such as tungsten hexafluoride ($WF_6$) or tungsten hexachloride ($WCl_6$). The precursor reacts with the hydrogen radicals to form the conductive layer 162.

There is a first distance $D_1$ between the first gate structure 160a and the second gate structure 160b. In some embodiments, the first distance $D_1$ is in a range from about 15 nm to about 40 nm.

The dummy fin structure 118 and the capping layer 120 are used as the barrier structure of the first gate structure 160a and the second gate structure 160b. The dummy fin structure 118 and the capping layer 120 are formed before the formation of the gate structure 160, and therefore the self-aligned cut metal gate (SACMG) is formed to prevent the alignment issue. The dummy fin structure 118 and the capping layer 120 are made of different materials to have etching selectivity during the removal process shown in FIG. 1G.

In addition, the top surface of the first hard mask layer 108, the top surface of the first liner 116 and the top surface of the capping layer 120 form a planar top surface, and the etching stop layer 121 is formed over the planar top surface. It should be noted that the dummy gate structure 122 is also formed over the planar top surface, and the dummy gate structure 122 is not filled into a gap between two fin structures. Therefore, the void issue when the dummy gate structure 122 is filled into the gap is prevented.

The inner spacer layer 136 is between the S/D structure 138 and the gate structure 160 to be effectively used as a barrier to reduce the parasitic capacitance between the S/D structure 138 and the gate structure 160.

If the dummy fin structure is formed on a remaining fin structure (the height of the remaining fin structure is lower than the fin structure), the distance between the first gate structure 160a and the second gate structure 160b will be twice of the pitch of the two adjacent fin structures 110. In this disclosure, the dummy fin structure is directly formed on the isolation structure 114, and therefore the distance between the first gate structure 160a and the second gate structure 160b is about the pitch of the two adjacent fin structures 110. Therefore, the distance between two gate structures is greatly reduced.

Figure 3:
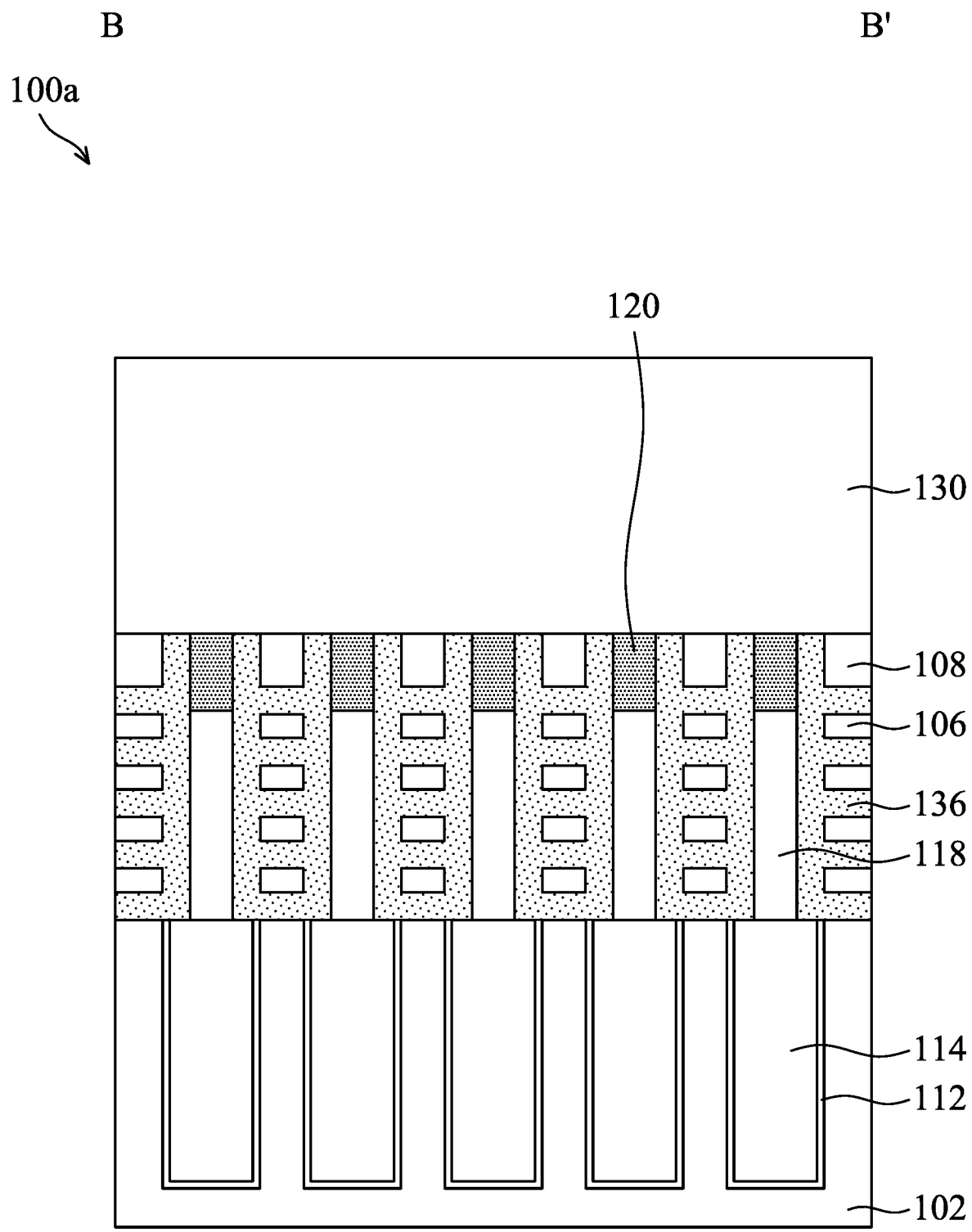
FIG. 3 shows a cross-sectional representation of the semiconductor device structure along line BB' shown in FIG. 1K, in accordance with some embodiments of the disclosure.

FIG. 3 shows a cross-sectional representation of the semiconductor device structure 100a along line BB' shown in FIG. 1K, in accordance with some embodiments of the disclosure.

As shown in FIG. 3, the inner spacer layer 136 is below the gate spacer layer 130. The dummy fin structure 118 are surrounded by the inner spacer layer 136, and the second semiconductor layers 106 are surrounded by the inner spacer layer 136. In addition, the capping layer 120 is surrounded by the inner spacer layer 136 and is in direct contact with the inner spacer layer 136.

Figure 4:
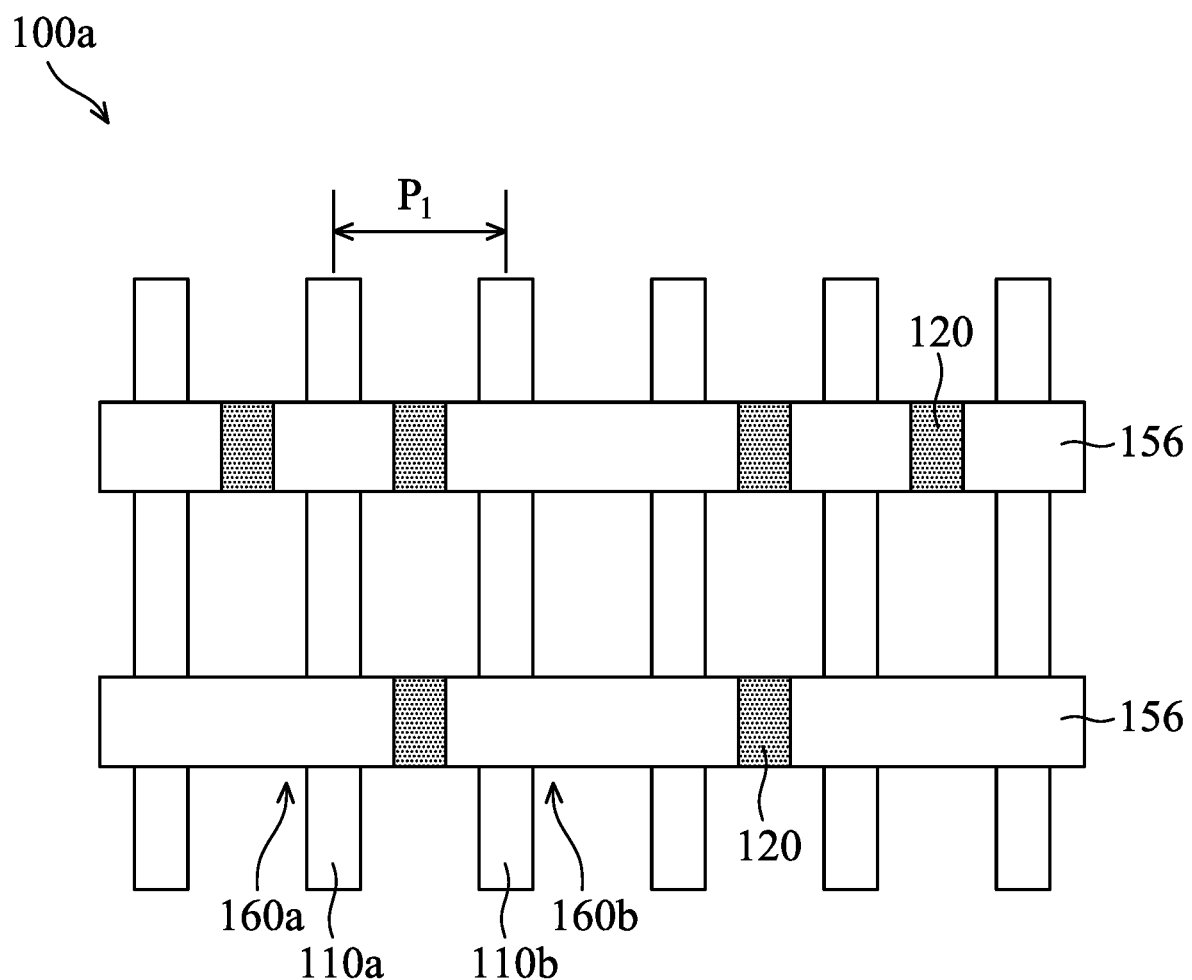
FIG. 4 shows a top-view representation of the semiconductor device structure, in accordance with some embodiments of the disclosure.

FIG. 4 shows a top-view representation of the semiconductor device structure 100a, in accordance with some embodiments of the disclosure. FIG. 4 is a top-view of the semiconductor device structure 100a before the conductive layer 162 is formed over the gate electrode layer 156.

As shown in FIG. 4, the capping layer 120 is used as a barrier structure to separate the first gate structure 160a and the second gate structure 160b. The capping layer 120 is formed in a region between the first fin structure 110a and the second fin structure 110b.

Figure 5A:
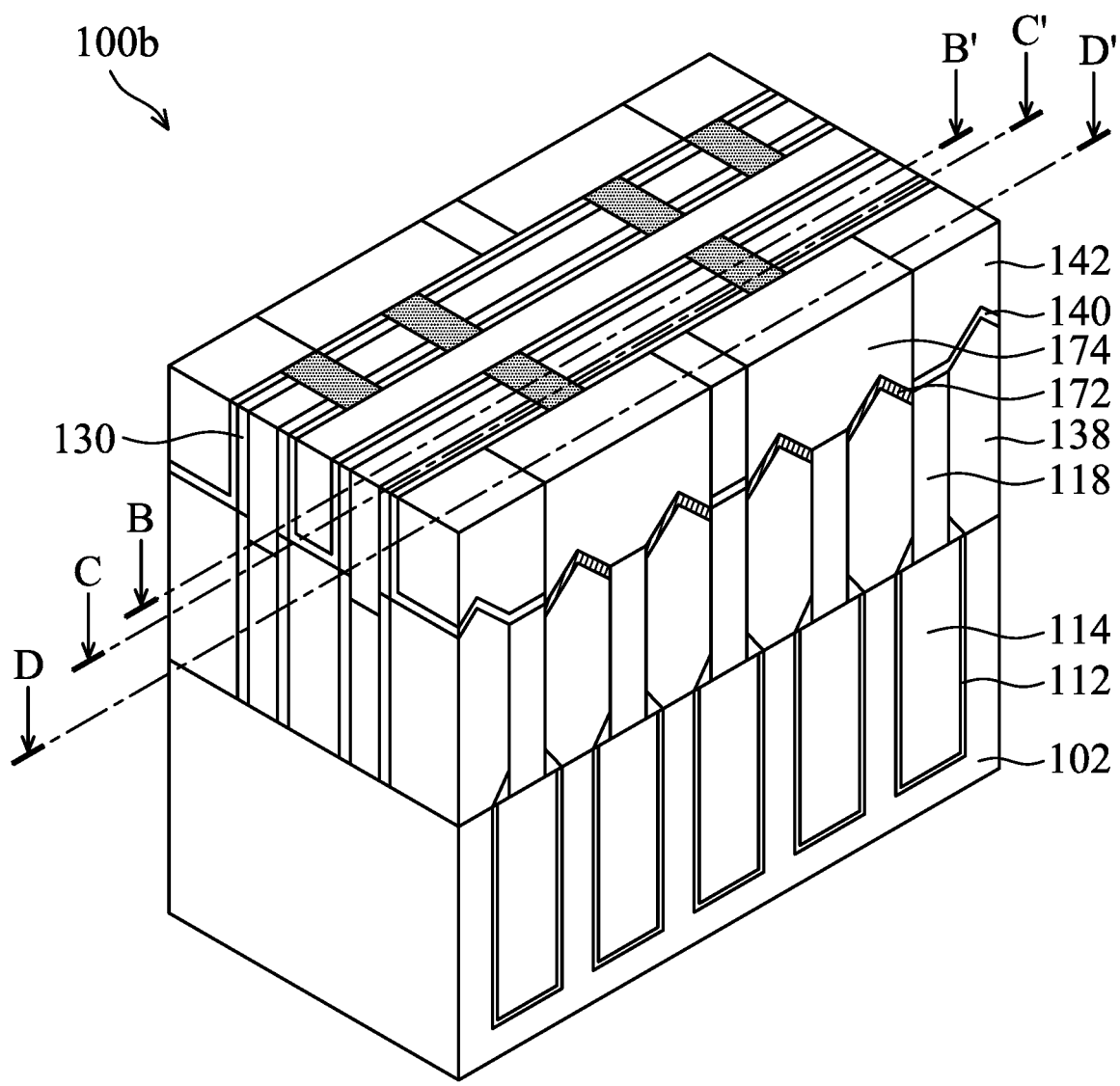
FIG. 5A shows a perspective representation of a semiconductor device structure, in accordance with some embodiments of the disclosure.
Figure 5B:
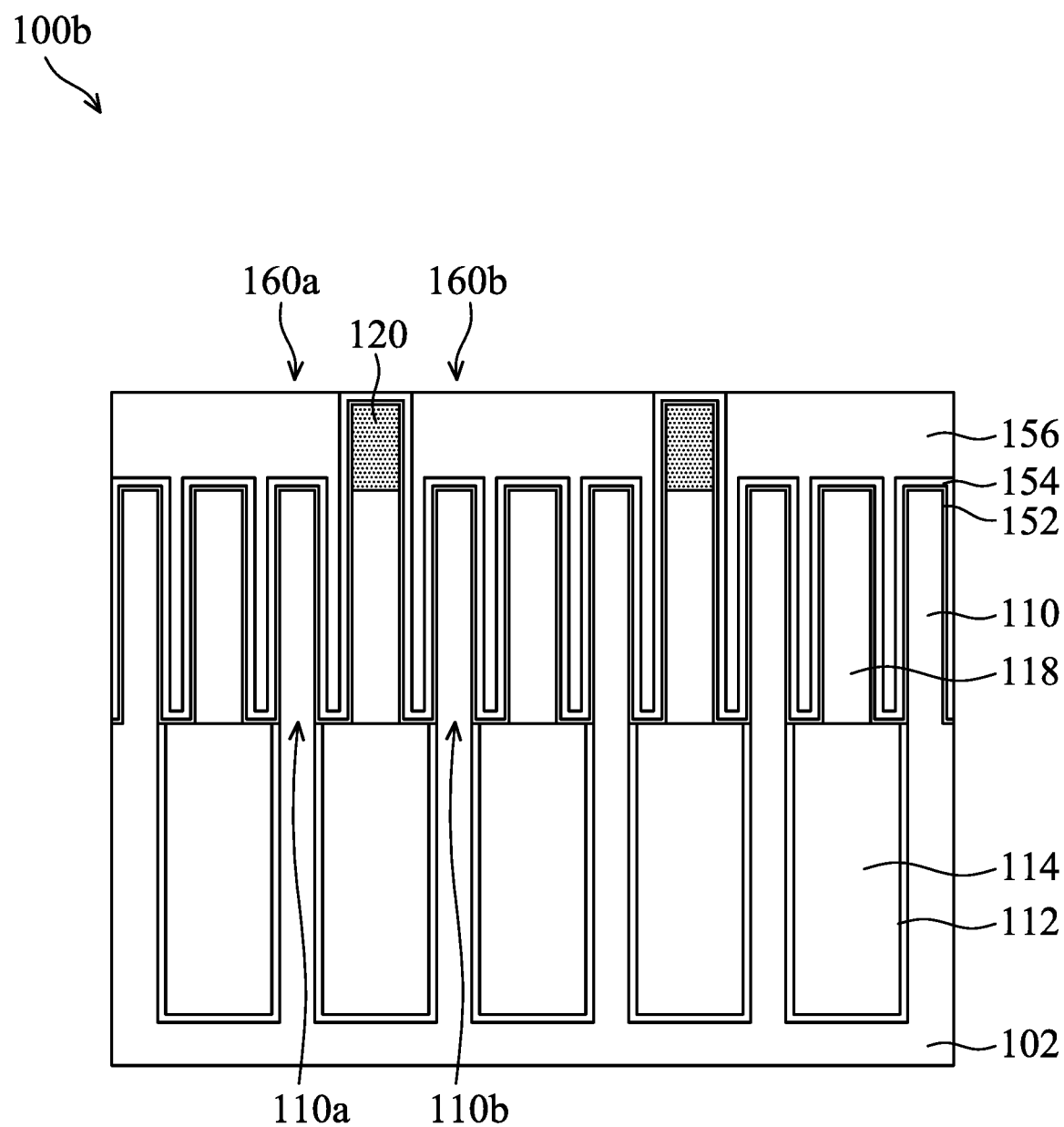
FIG. 5B shows a cross-sectional representation of the semiconductor device structure along line BB' shown in FIG. 5A, in accordance with some embodiments of the disclosure.

FIG. 5A shows a perspective representation of a semiconductor device structure 100b, in accordance with some embodiments of the disclosure. The semiconductor device structure 100b is a fin field effect transistor (FinFET). FIG. 5B shows a cross-sectional representation of the semiconductor device structure along line BB' shown in FIG. 5A, in accordance with some embodiments of the disclosure. The semiconductor device structure 100b of FIG. 5A is similar to the semiconductor device structure 100a of FIG. 1K, the differences between FIG. 5A and FIG. 1K are that fin structure 110 is in FIG. 5A (stacked first semiconductor layers 104 and second semiconductor layers 106 are in FIG. 1K), and a silicide layer 172 is formed over the S/D structure 138, and an S/D contact structure 174 is formed over the silicide layer 172.

As shown in FIGS. 5A and 5B, the dummy fin structure 118 is formed over the isolation structure 114, the first fin structure 110a and the second fin structure 110b, and the capping layer 120 is formed over the dummy fin structure 118. The first gate structure 160a and the second gate structure 160b are separated by the dummy fin structure 118 and the capping layer 120. The top surface of the capping layer 120 is higher than the top surface of the first fin structure 110a and the second fin structure 110b.

Figure 5C:
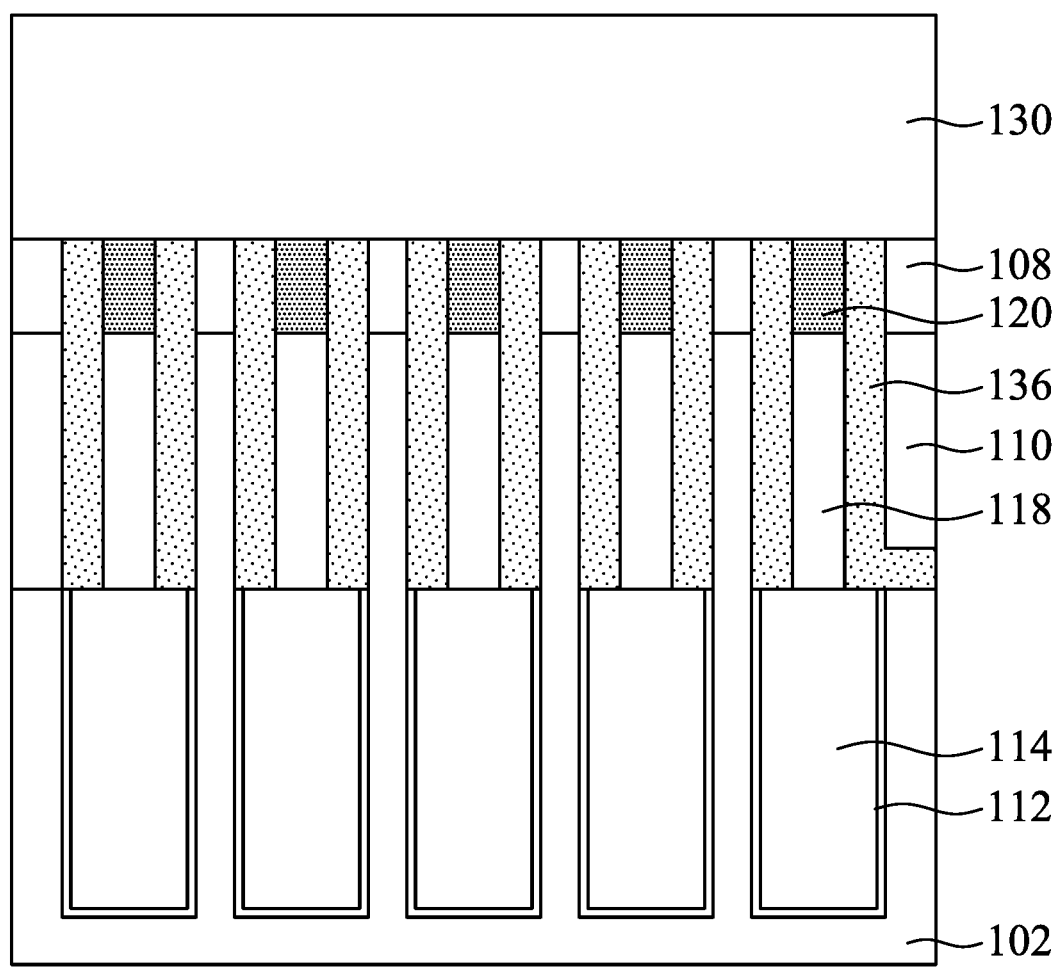
FIG. 5C shows a cross-sectional representation of the semiconductor device structure along line CC' shown in FIG. 5A, in accordance with some embodiments of the disclosure.

FIG. 5C shows a cross-sectional representation of the semiconductor device structure along line CC' shown in FIG. 5A, in accordance with some embodiments.

As shown in FIG. 5C, the inner spacer layer 136 is below the gate spacer layer 130. The dummy fin structure 118 is surrounded by the inner spacer layer 136, and the fin structure 110 is surrounded by the inner spacer layer 136. The inner spacer layer 136 is formed on the sidewall surface of the fin structure 110, and on the sidewall surface of the capping layer 120.

Figure 5D:
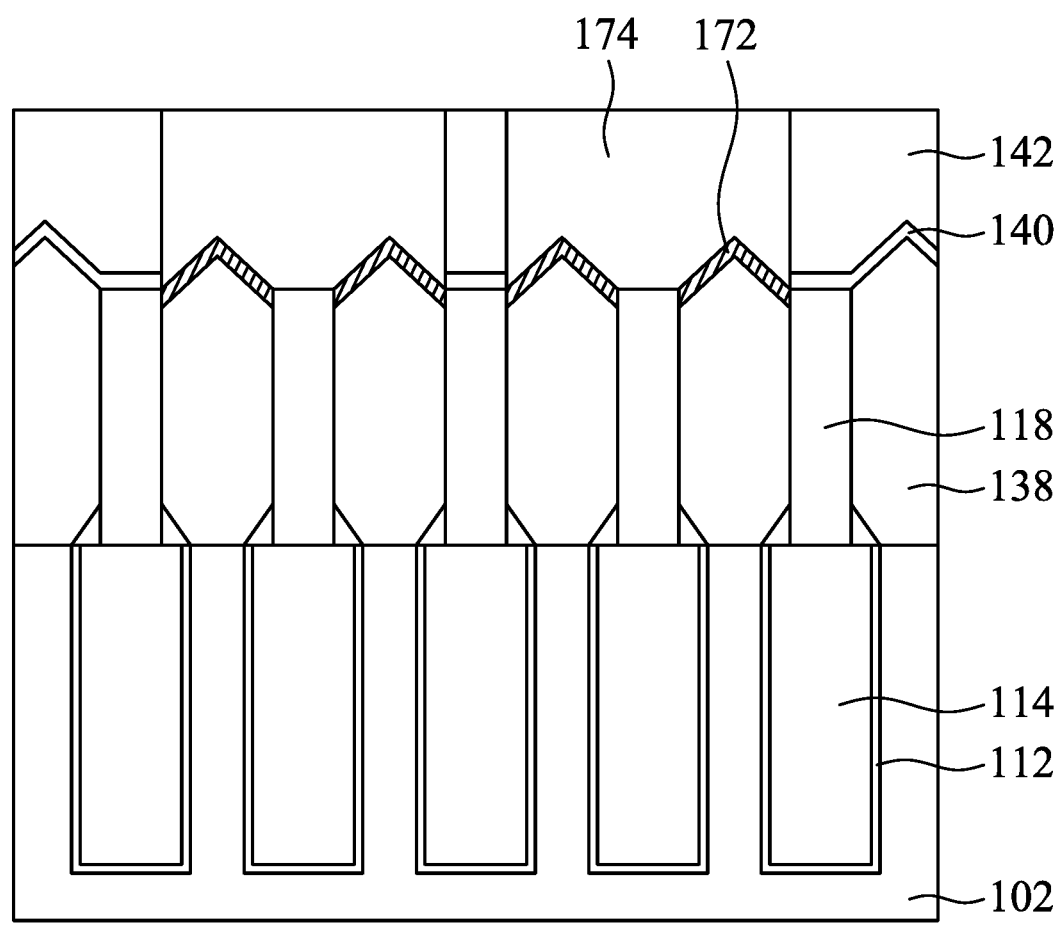
FIG. 5D shows a cross-sectional representation of the semiconductor device structure along line DD' shown in FIG. 5A, in accordance with some embodiments of the disclosure.

FIG. 5D shows a cross-sectional representation of the semiconductor device structure along line DD' shown in FIG. 5A, in accordance with some embodiments.

As shown in FIG. 5D, the silicide layer 172 is formed over the S/D structure 138, and the S/D contact structure 174 is formed over the silicide layer 172.

Figure 6A:
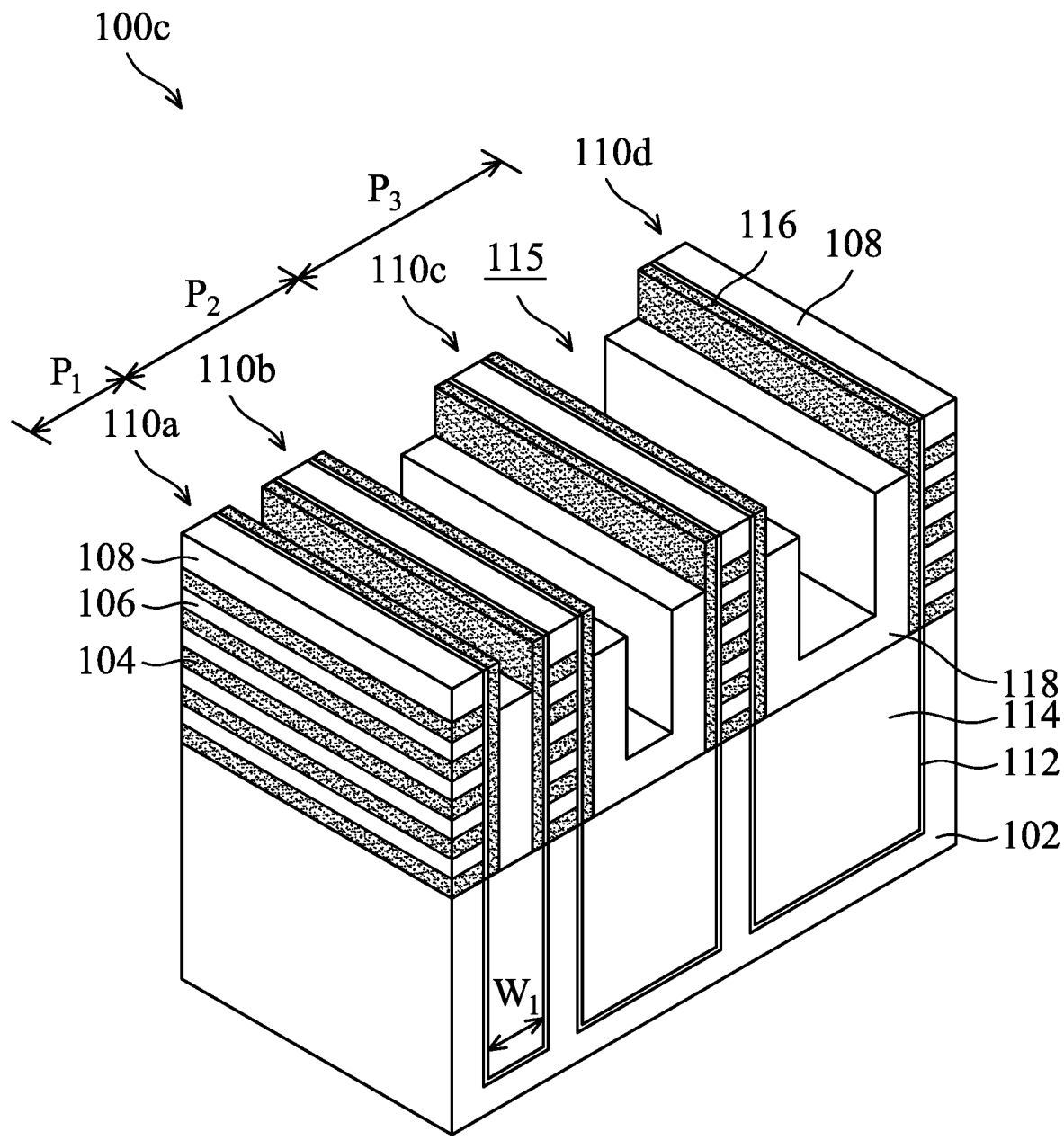
FIGS. 6A-6B show perspective representations of various stages of forming of a semiconductor device structure, in accordance with some embodiments of the disclosure.
Figure 6B:
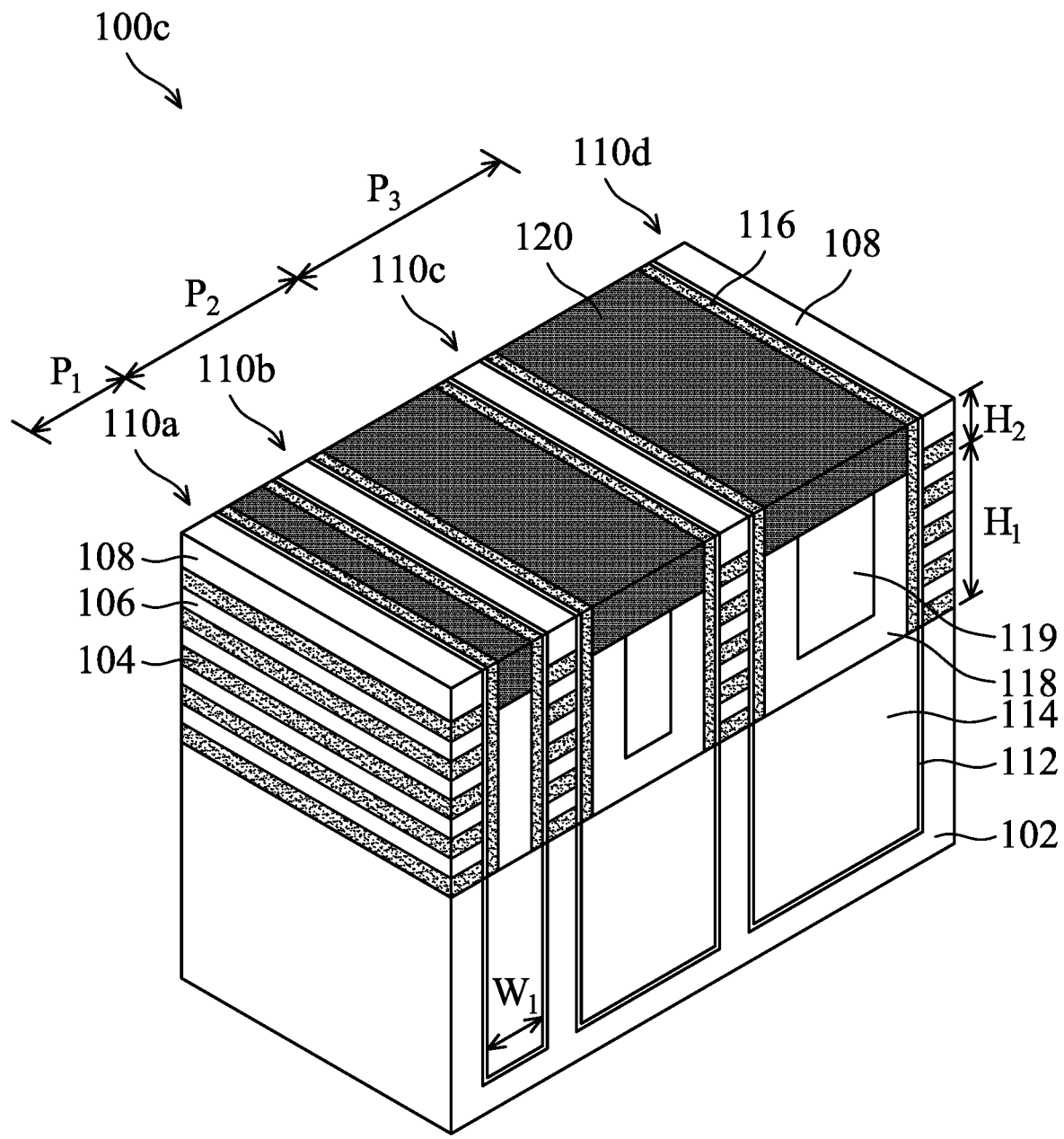

FIGS. 6A-6B show perspective representations of various stages of forming of a semiconductor device structure 100c, in accordance with some embodiments of the disclosure. The semiconductor device structure 100c of FIG. 6A is similar to the semiconductor device structure 100a of FIG. 1D, the difference between FIG. 6A and FIG. 1D is that the dummy fin structure 118 has a U-shaped structure with a recessed portion.

As shown in FIG. 6A, the first pitch $P_1$ is between the first fin structure 110a and the second fin structure 110b, the second pitch $P_2$ is between the second fin structure 110b and the third fin structure 110c. The third pitch $P_3$ is between the third fin structure 110c and the fourth fin structure 110d. In some embodiments, the third pitch $P_3$ is greater than the second pitch $P_2$, and the second pitch $P_2$ is greater than the first pitch $P_1$. Since the gap filling ability of the dummy fin structure 118 is limited to the kind of materials, the trench 115 may be not filled with the dummy fin structure 118. Therefore, the U-shaped dummy fin structure 118 is obtained. The dummy fin structure 118 has a recession portion in the middle portion.

Afterwards, as shown in FIG. 6B, a filling layer 119 is formed in the recession of the dummy fin structure 118, in accordance with some embodiments of the disclosure. Next, the capping layer 120 is formed over the dummy fin structure 118 and the filling layer 119. In some embodiments, the filling layer 119 and the dummy fin structure 118 are made of different materials. In some embodiments, the filling layer 119 is formed by a flowable CVD (FCVD) process. Afterwards, the semiconductor device structure 100c continues to proceed to the processes illustrated in FIGS. 1F to 1K.

FIGS. 7A-7I show perspective representations of various stages of forming a semiconductor device structure 100d, in accordance with some embodiments of the disclosure.

Figure 7A:
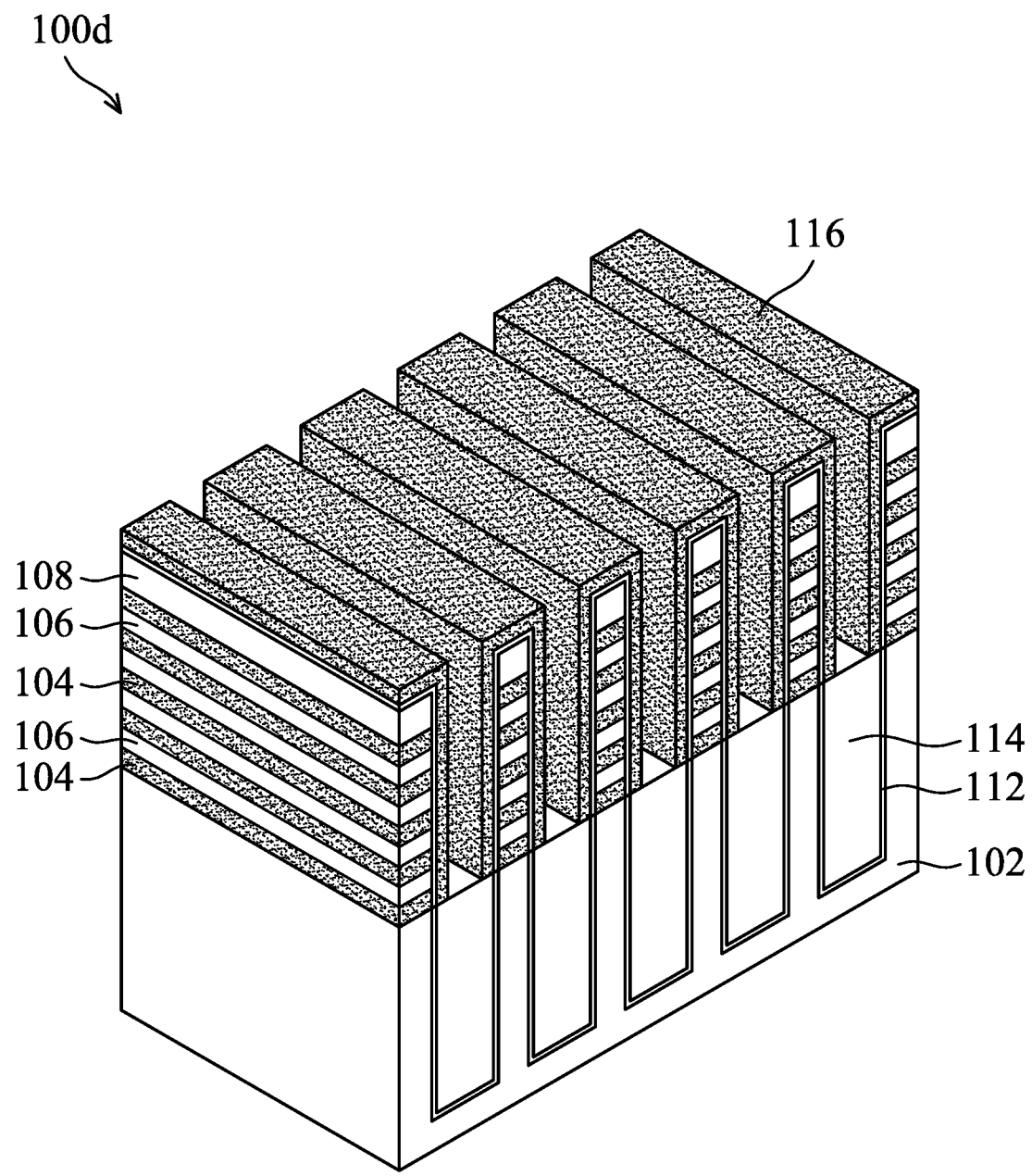
FIGS. 7A-7I show perspective representations of various stages of forming a semiconductor device structure, in accordance with some embodiments of the disclosure.

FIG. 7A is similar to, or the same as FIG. 1D, the fin structures 110 are extended above the isolation structure 114. The seed layer 112 is formed on sidewall surfaces of the fin structures 110, and the first liner 116 is formed on the seed layer 112.

Figure 7B:
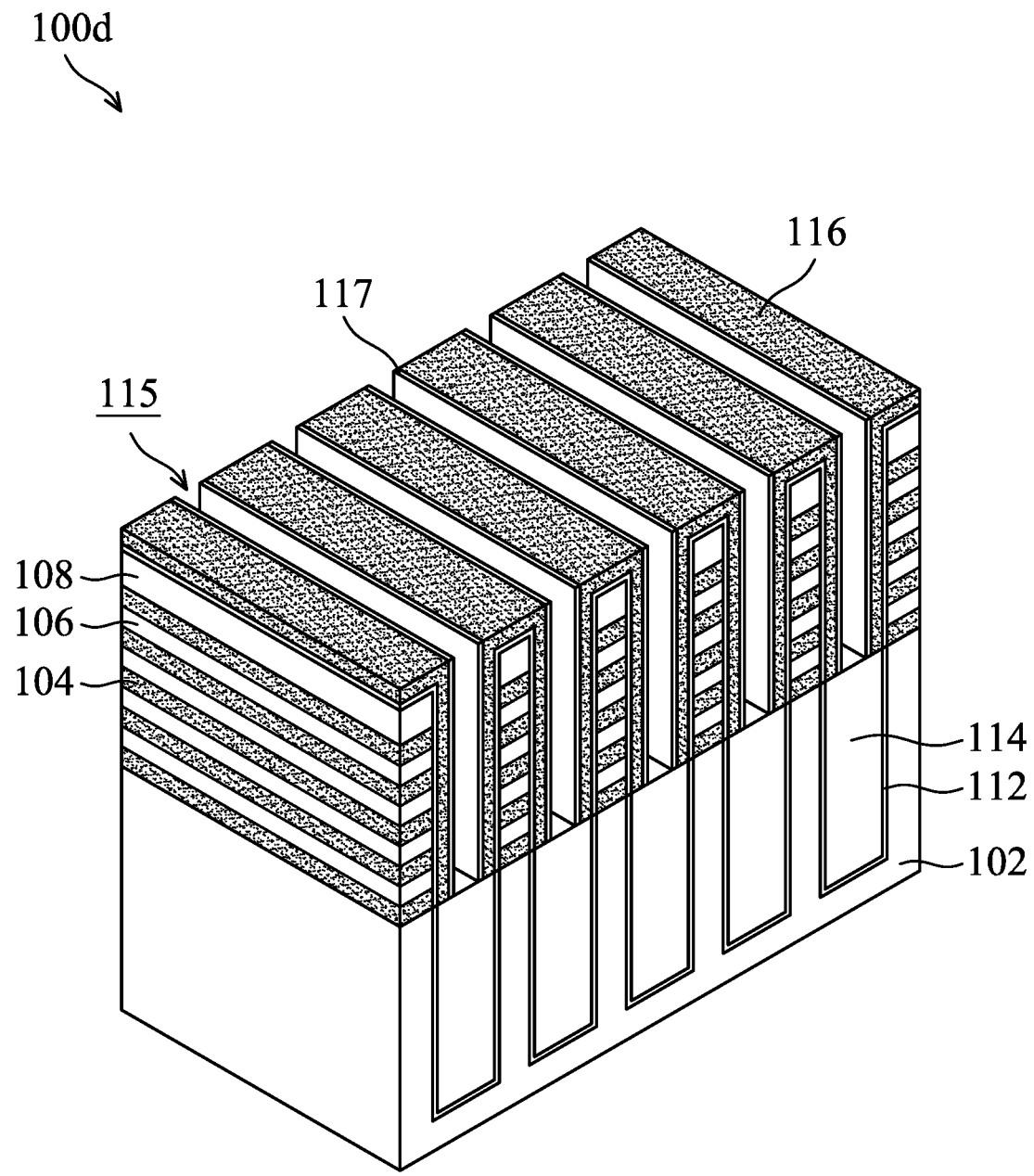

Next, as shown in FIG. 7B, a second liner 117 is formed on the first liner 116, in accordance with some embodiments of the disclosure. The first liner 116 and the second liner 117 are made of different materials. The trench 115 is not completely filled with the first liner 116 and the second liner 117.

In some embodiments, the second liner 117 is made of dielectric layer, such as silicon nitride, silicon carbon nitride (SiCN), or applicable material. In some embodiments, the second liner 117 is formed by a chemical vapor deposition (CVD) process, an atomic layer deposition (ALD) process, a physical vapor deposition (PVD) or another applicable process.

Figure 7C:
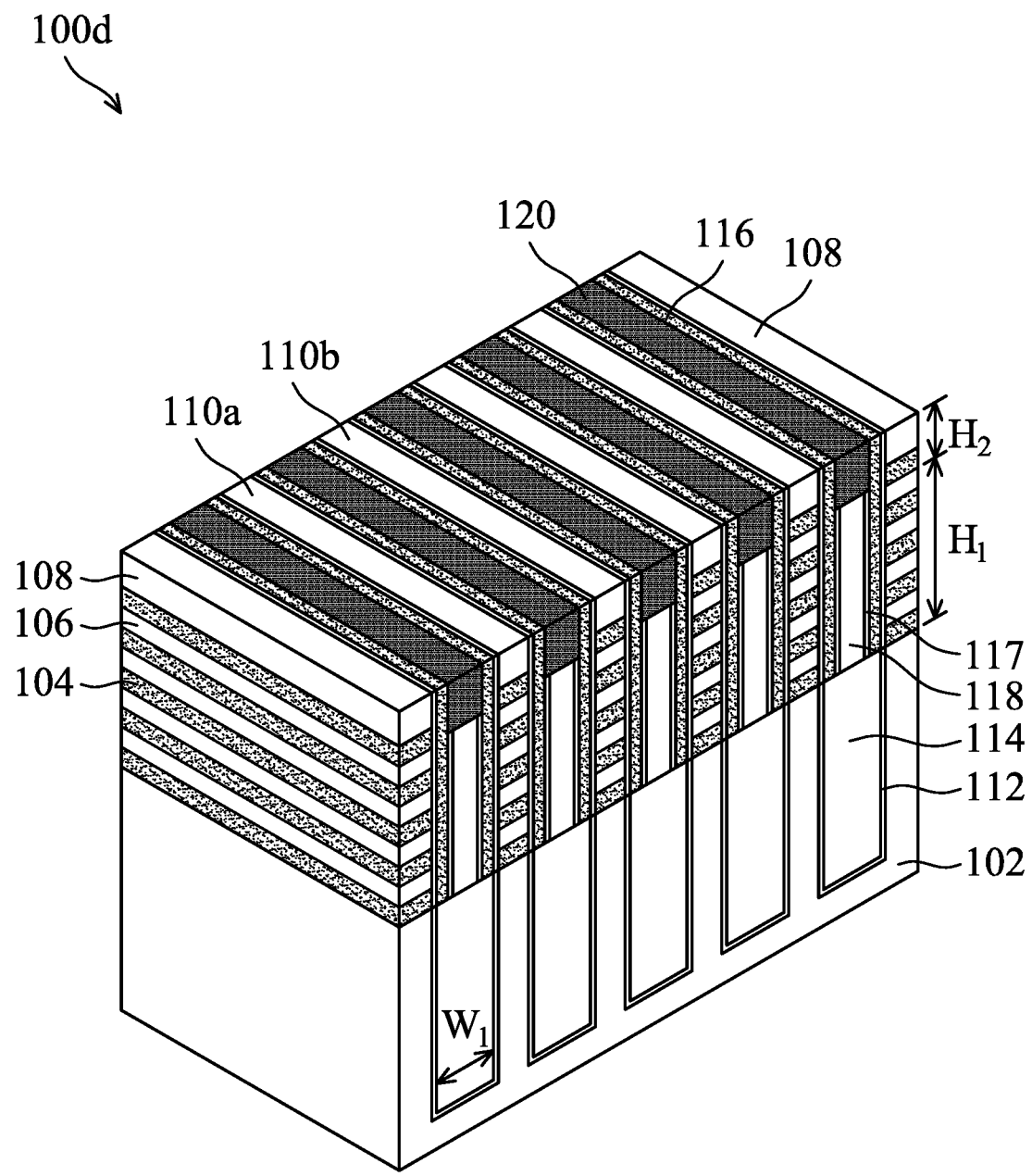

Afterwards, as shown in FIG. 7C, the dummy fin structure 118 is formed in the trench 115, and the capping layer 120 is formed over the first liner 116 and the second liner 117, in accordance with some embodiments of the disclosure.

The first liner 116 is formed firstly, and then the second liner 117 is formed. Next, the dummy fin structure 118 is formed on the sidewall surface of the second liner 117, and therefore the dummy fin structure 118 is in direct contact with the second liner 117, but not in direct contact with the first liner 116.

Figure 7D:
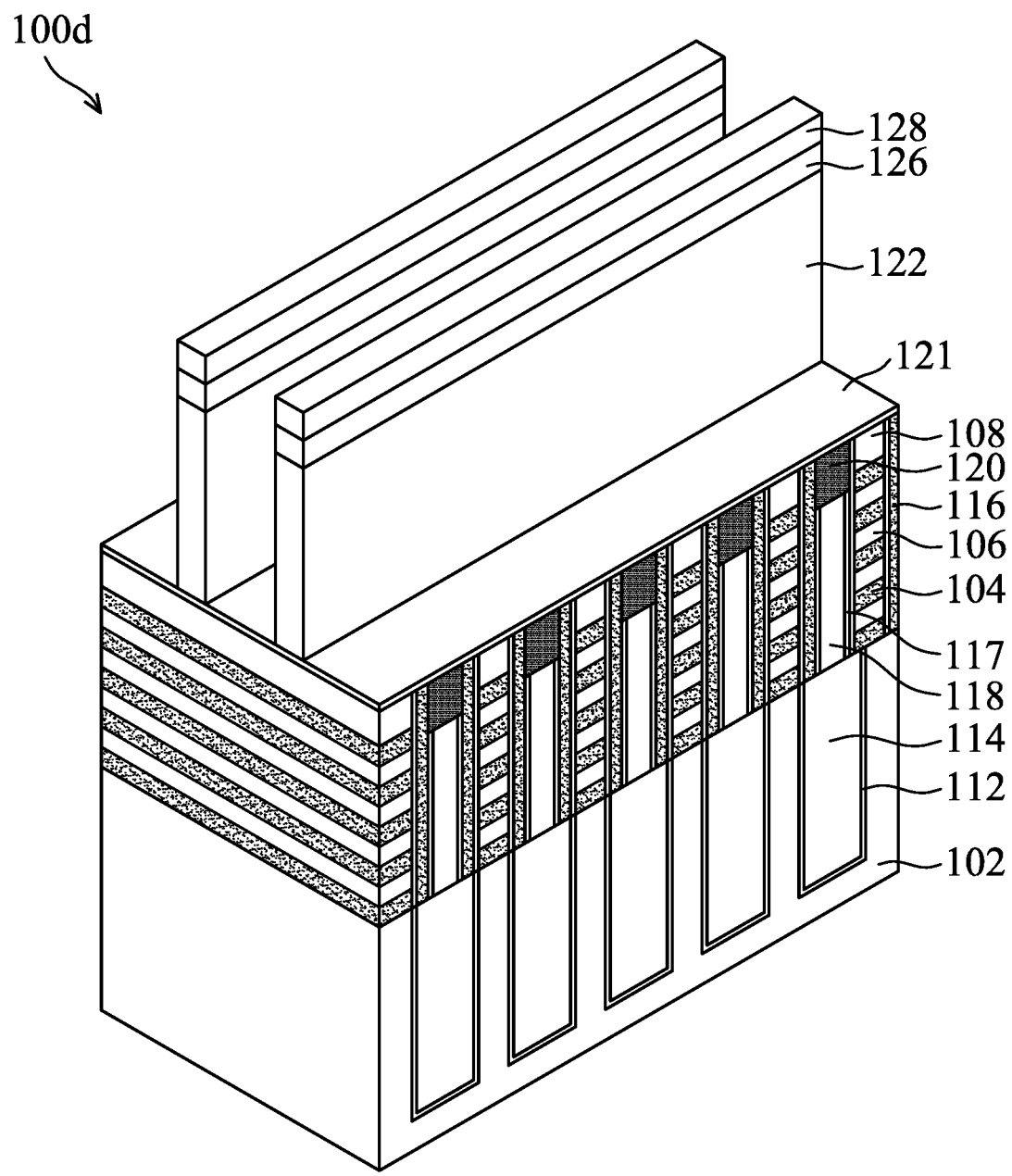

Afterwards, as shown in FIG. 7D, the etching stop layer 121 is formed over the capping layer 120, the first hard mask layer 108 and the first liner 116, in accordance with some embodiments of the disclosure. Afterwards, the dummy gate structure 122 is formed over the etching stop layer 121. The second mask layer 126 is formed over the dummy gate structure 122, and the third mask layer 128 is formed over the second mask layer 126.

Figure 7E:
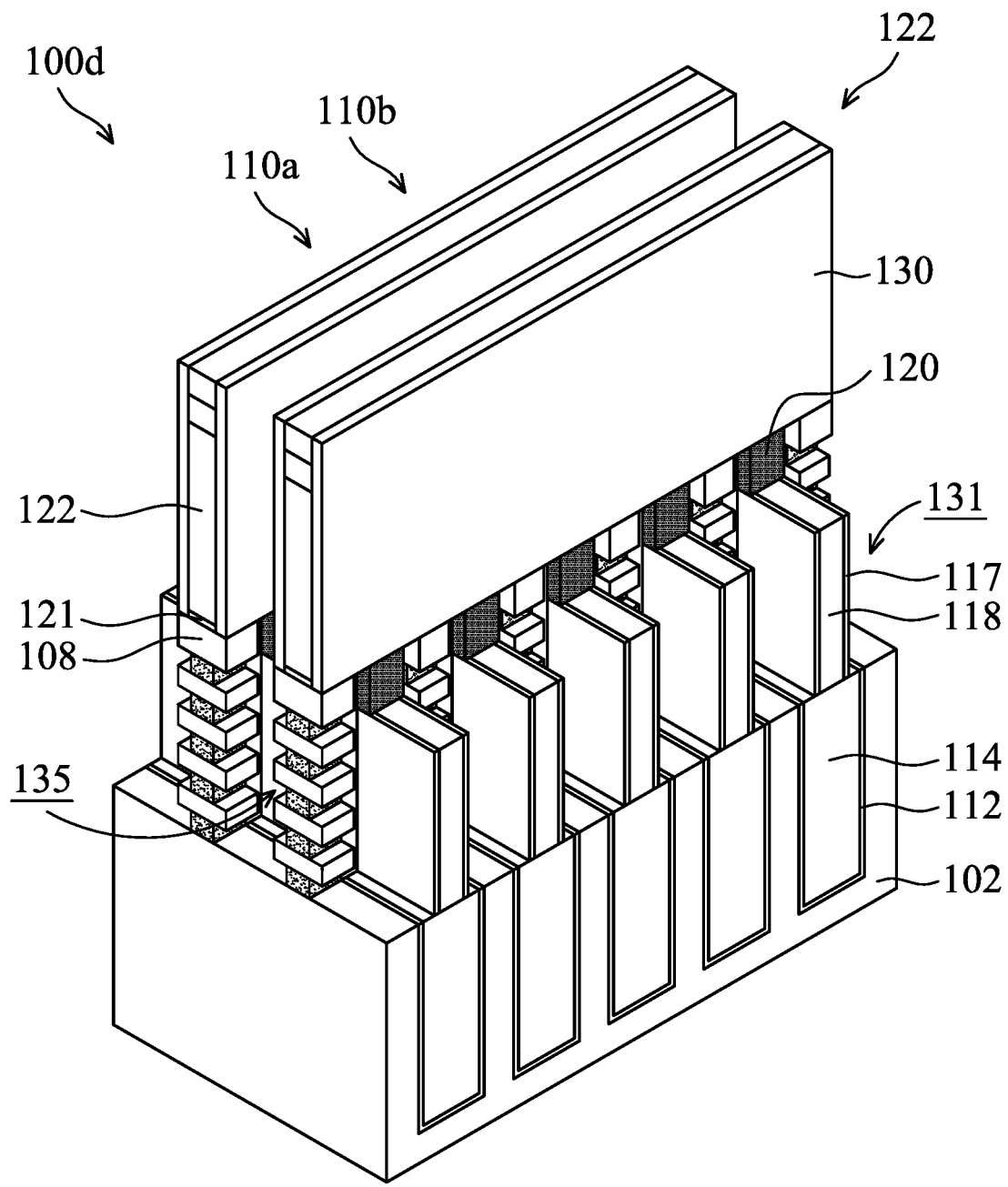

Afterwards, as shown in FIG. 7E, the gate spacer layer 130 is formed on opposite sidewall surfaces of the dummy gate structure 122, in accordance with some embodiments of the disclosure. Some layers not covered by the dummy gate structure 122 are removed to form the S/D recesses 131. Next, a portion of the first liner 116 and a portion of the first semiconductor layers 104 below the dummy gate structure 122 are removed to form a cavity 135. It should be noted that the second liner 117 is not removed while the portion of the first liner 116 is removed. The second liner 117 is left on the sidewall surface of the dummy fin structure 118 to increase the isolation effect between two adjacent S/D structure (formed later, as shown in FIG. 7G). The capping layer 120 is removed, but the dummy fin structure 118 and the second liner 119 are not removed.

Figure 7F:
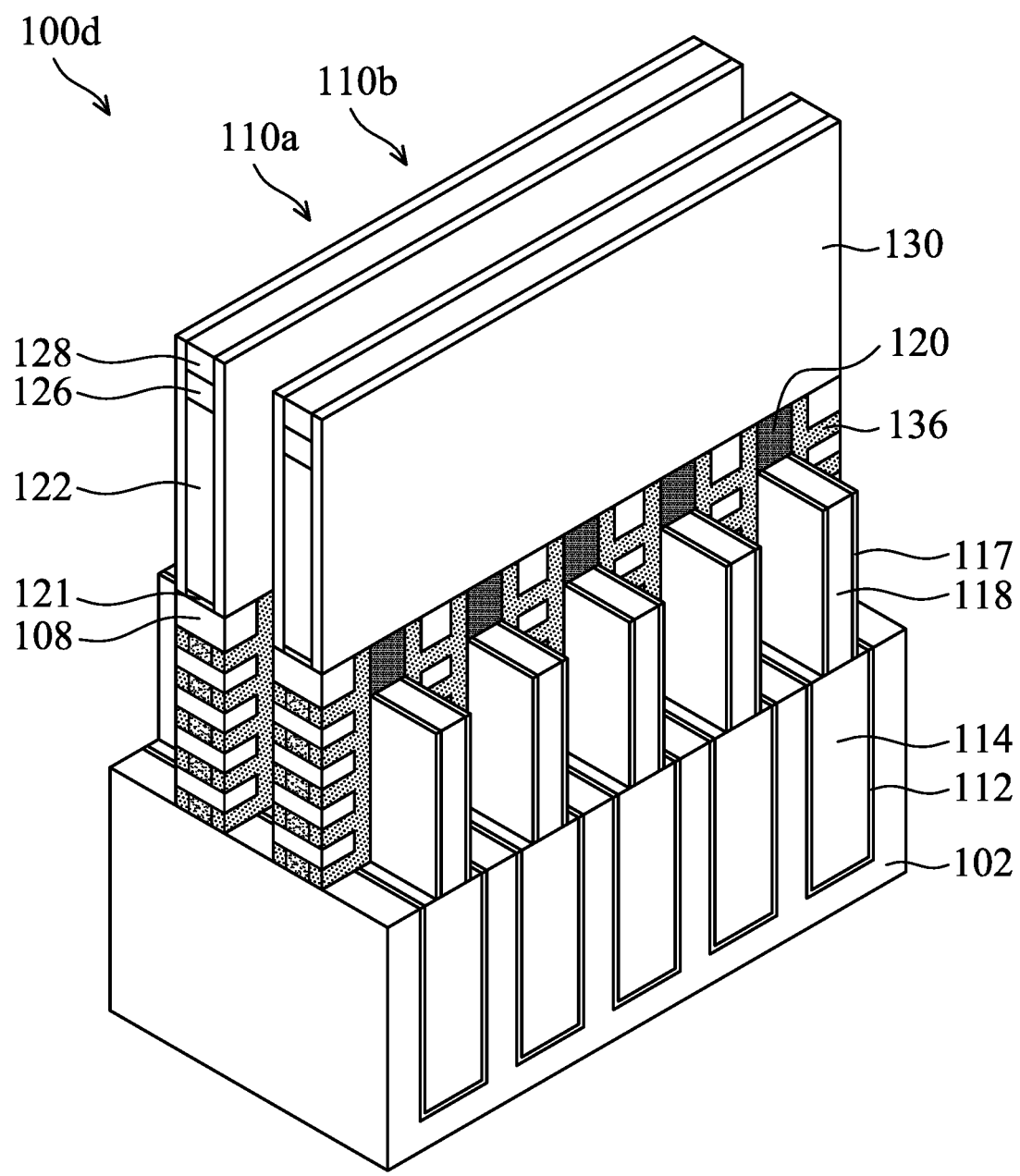
Figure 7G:
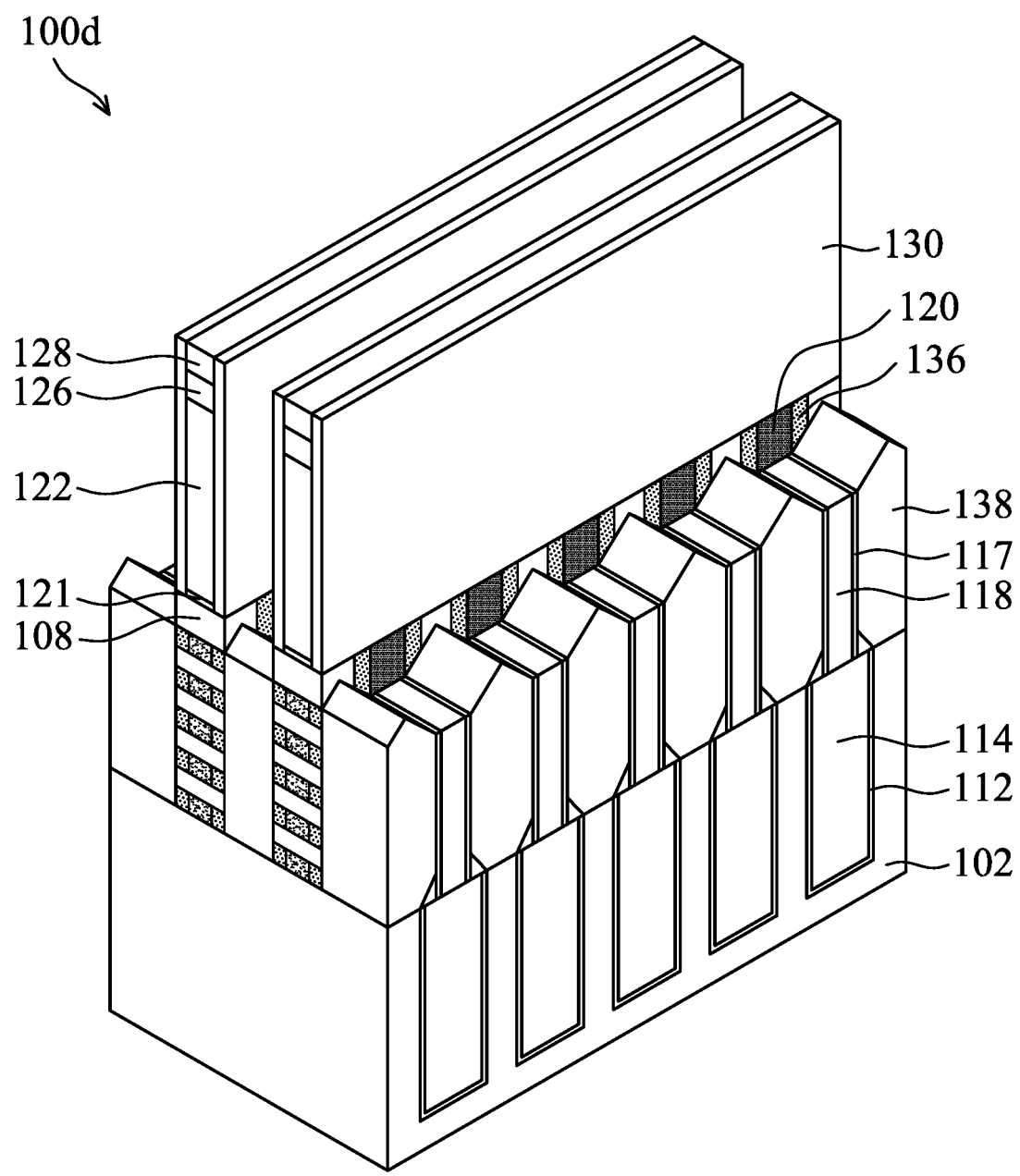

Next, as shown in FIG. 7F, the inner spacer layer 136 is formed in the cavity 135, in accordance with some embodiments of the disclosure.

Afterwards, as shown in FIG. 7G, the S/D structures 138 are formed in the S/D recesses 131, in accordance with some embodiments of the disclosure. It should be noted that the first liner 116 and the second liner 117 are between two adjacent S/D structures 138.

Figure 7H:
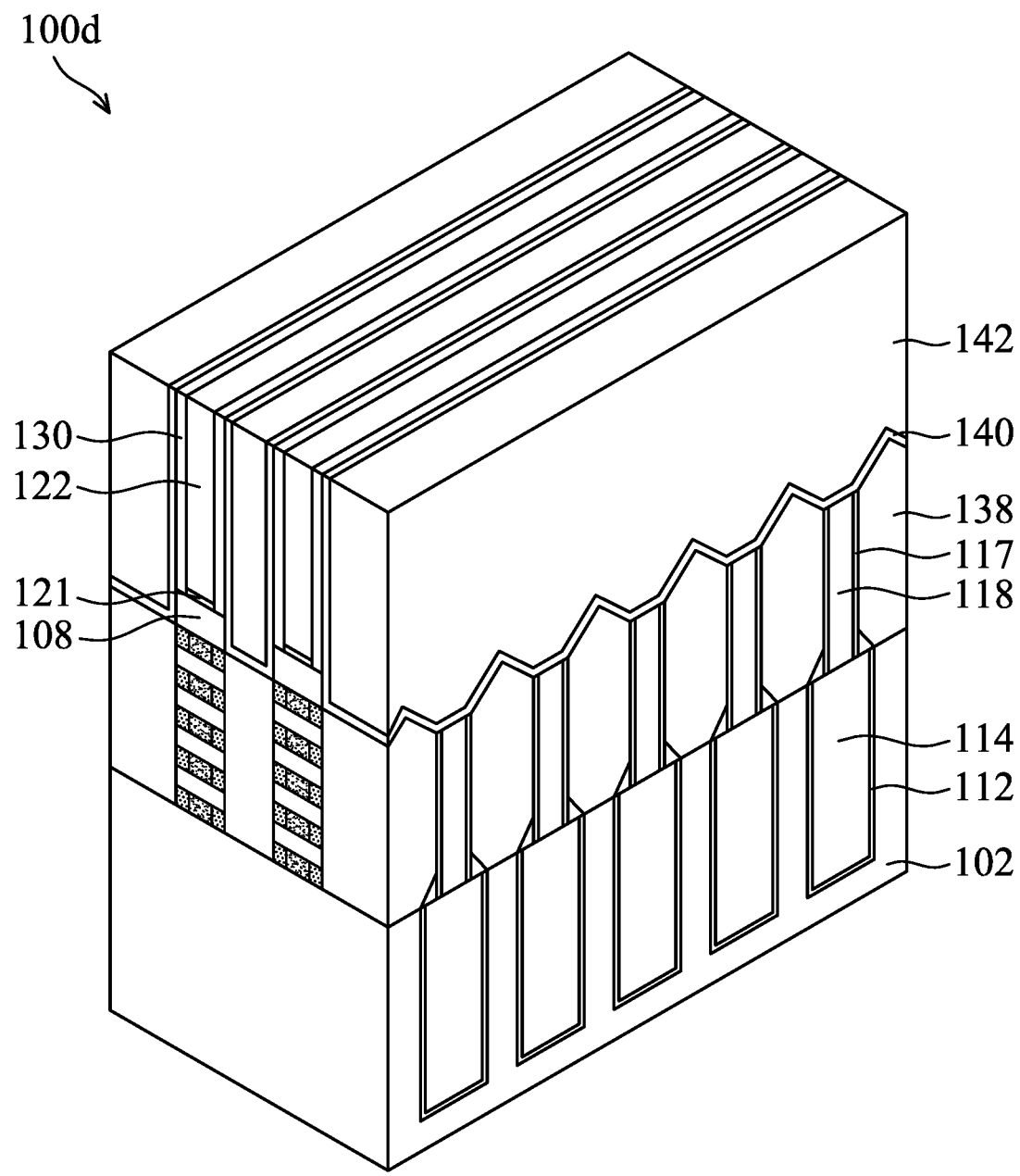

Subsequently, as shown in FIG. 7H, the CESL 140 is formed over the S/D structures 138, and an inter-layer dielectric (ILD) layer 142 is formed over the CESL 140, in accordance with some embodiments of the disclosure.

Figure 7I:
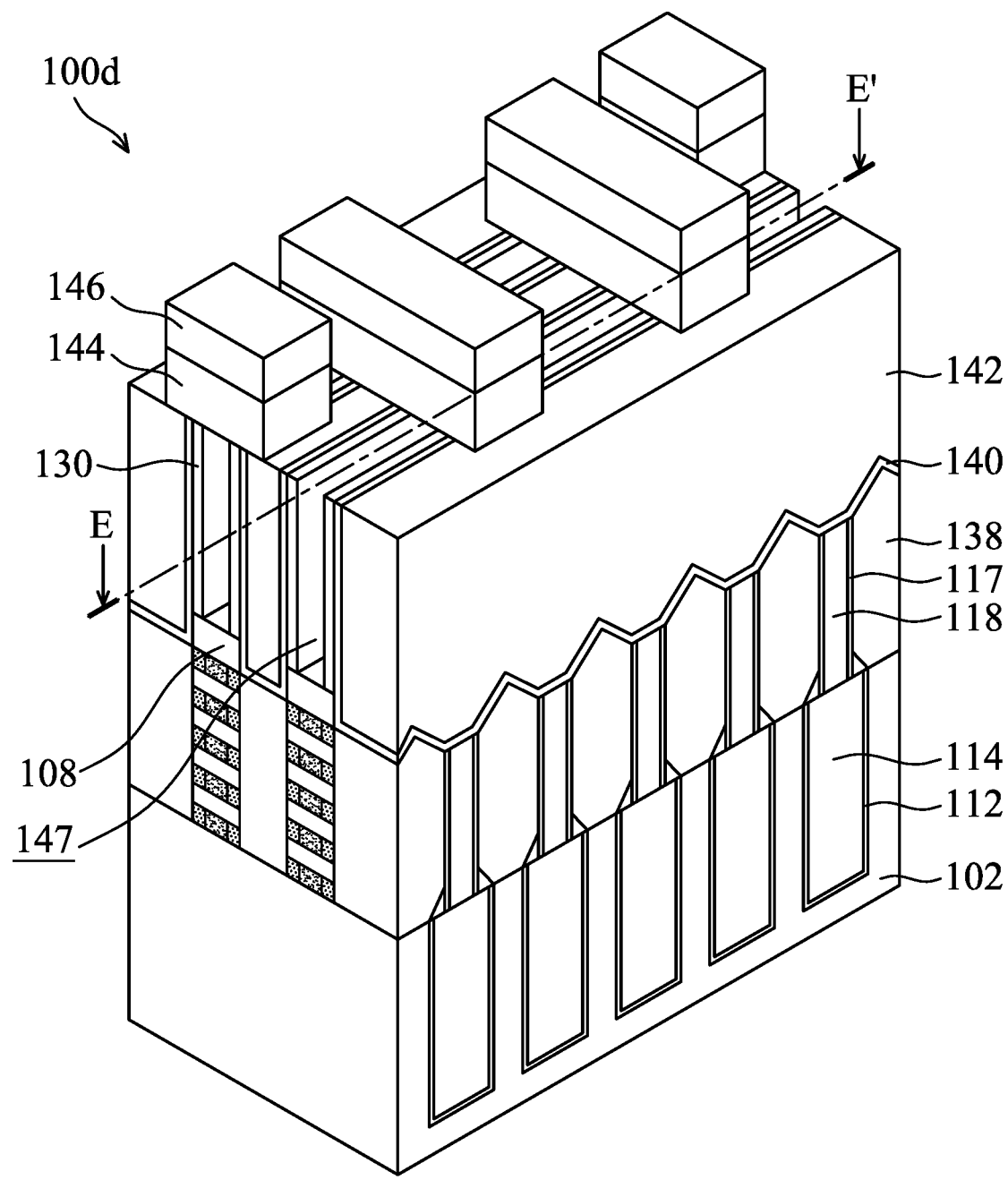

Next, as shown in FIG. 7I, the dummy gate structure 122 and the etching stop layer 121 are removed, in accordance with some embodiments. As a result, a trench 147 is formed to expose he first hard mask layer 108.

Figure 8A:
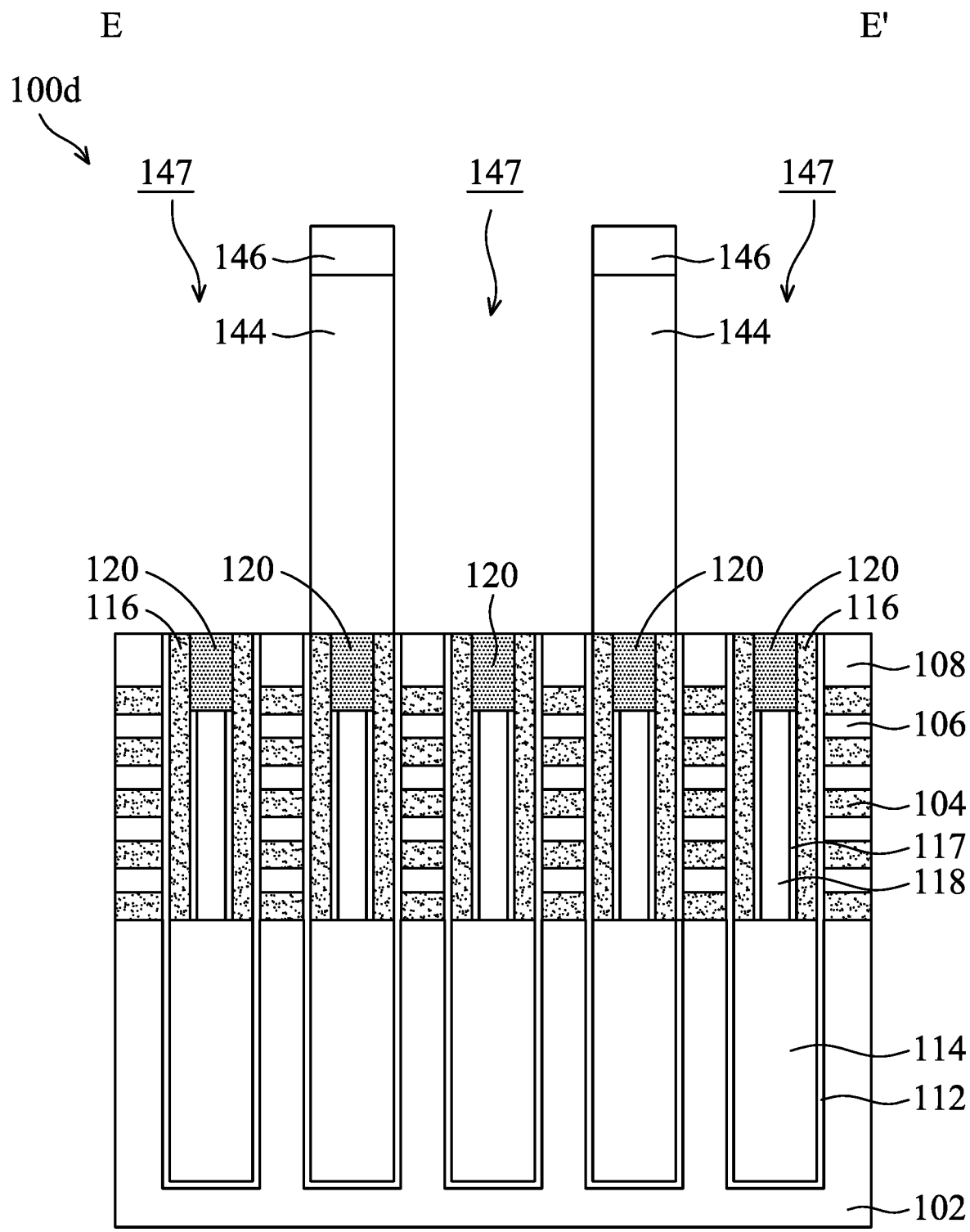
FIGS. 8A-8E show cross-sectional representations of various stages of forming the semiconductor device structure after FIG. 7I, in accordance with some embodiments of the disclosure.

FIGS. 8A-8E show cross-sectional representations of various stages of forming the semiconductor device structure 100d after FIG. 7I, in accordance with some embodiments of the disclosure. FIG. 8A shows a cross-sectional representation of the semiconductor device structure along line EE' shown in FIG. 7I, in accordance with some embodiments of the disclosure.

As shown in FIG. 8A, a number of capping layers 120 are formed over the isolation structure 114, and the fourth mask layer 144 is formed over a portion of the capping layers 120 to protect the capping layers 120 from being removed. The fifth mask layer 146 is formed over the fourth mask layer 144.

Figure 8B:
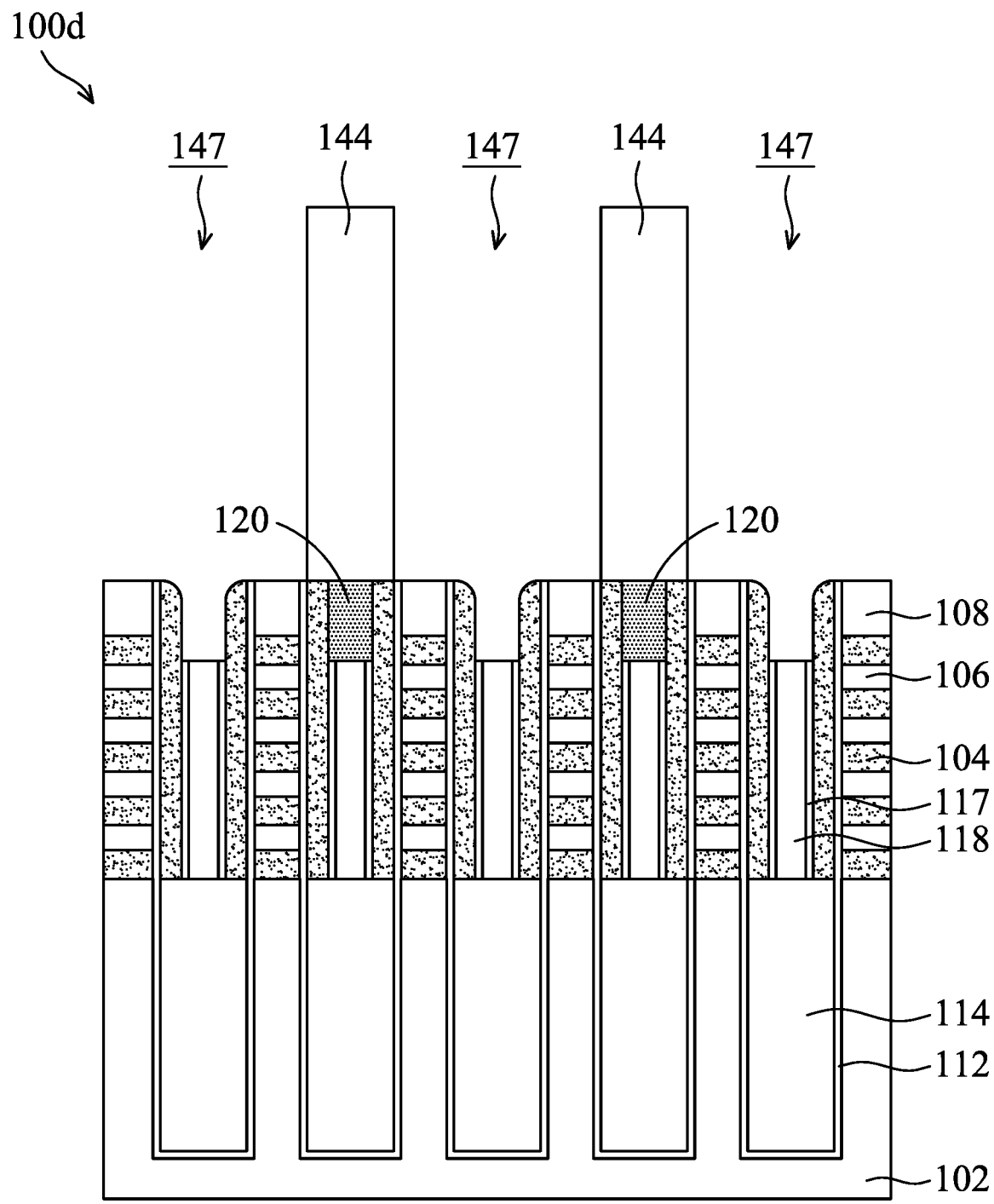

Next, as shown in FIG. 8B, some capping layers 120 are removed by the removal process, but some capping layers 120 are protected by the fourth mask layer 144, in accordance with some embodiments. The capping layers 120 are surrounded by the first liners 116. During the removal process, a portion of the first liners 116 is removed. Afterwards, the fifth mask layer 146 is removed.

Figure 8C:
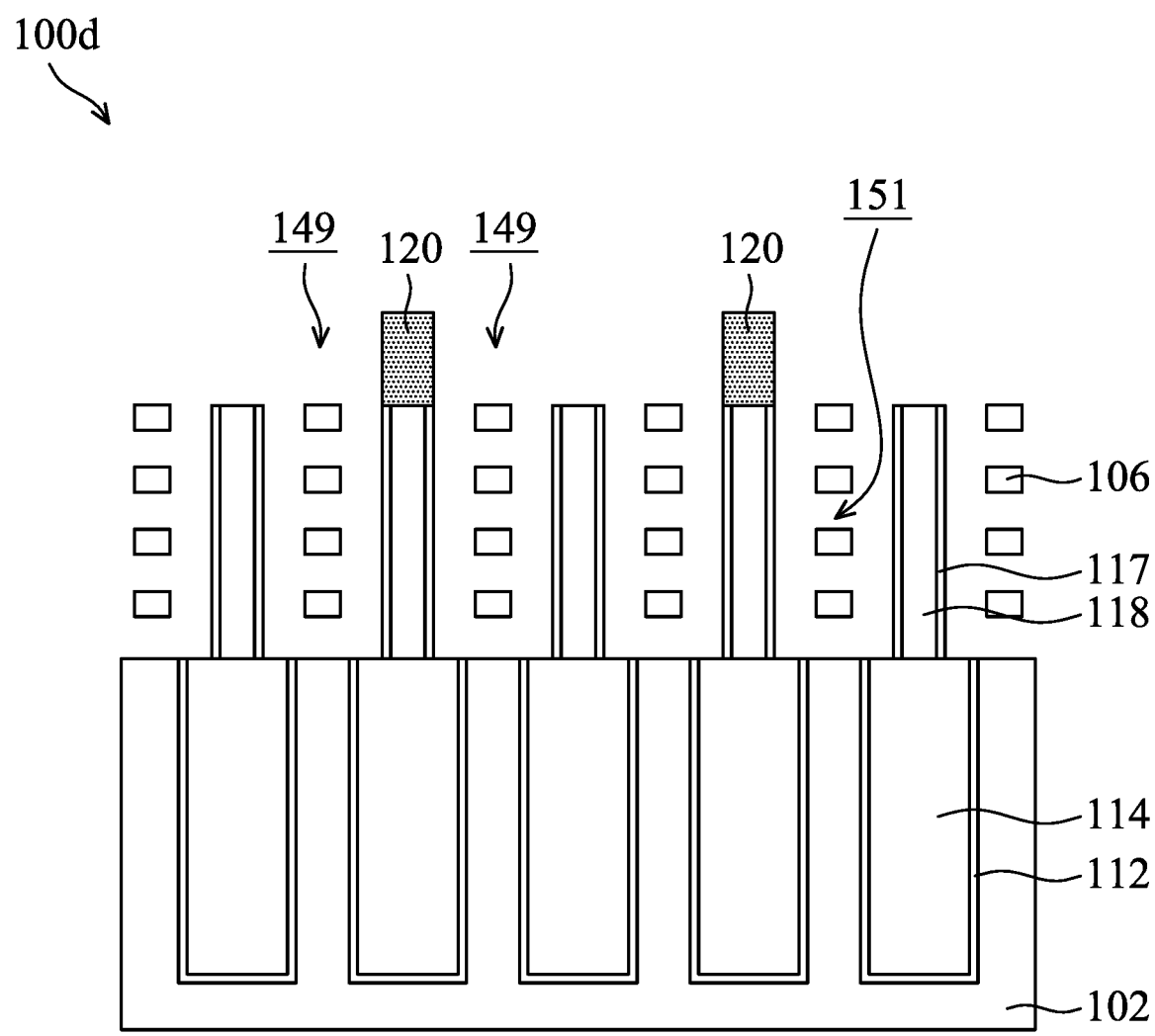

Next, as shown in FIG. 8C, the fourth mask layer 144 is removed, and the first hard mask layer 108 is removed, in accordance with some embodiments. Next, the first liners 116 are removed to form recess 149, and the first semiconductor layers 104 are removed to form gaps 151. In some embodiments, the first liners 116 are made of silicon germanium (SiGe), and the first semiconductor layers 104 are made of silicon germanium (SiGe), and therefore, the first liners 116 and the first semiconductor layers 104 are simultaneously removed.

Figure 8D:
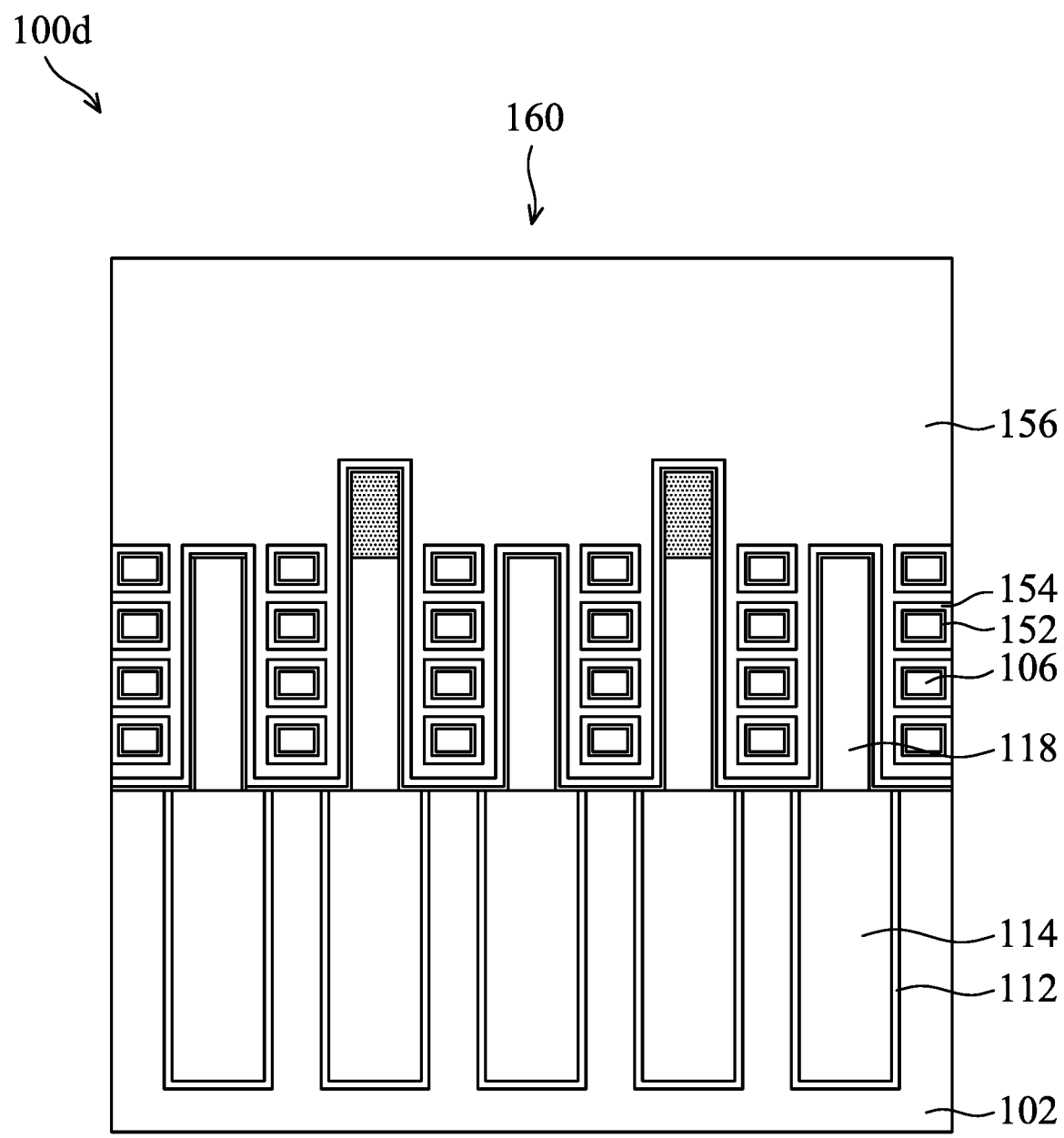

Afterwards, as shown in FIG. 8D, the second liner 117 which is directly below the trench 147 is removed, in accordance with some embodiments. It should be noted that the first liner 116 and the second liner 117 are made of different materials, and the first liner 116 and the second liner 117 are removed by separate processes. Furthermore, the second liner 117 which is in direct contact with the S/D structure 138 is not removed.

Figure 8E:
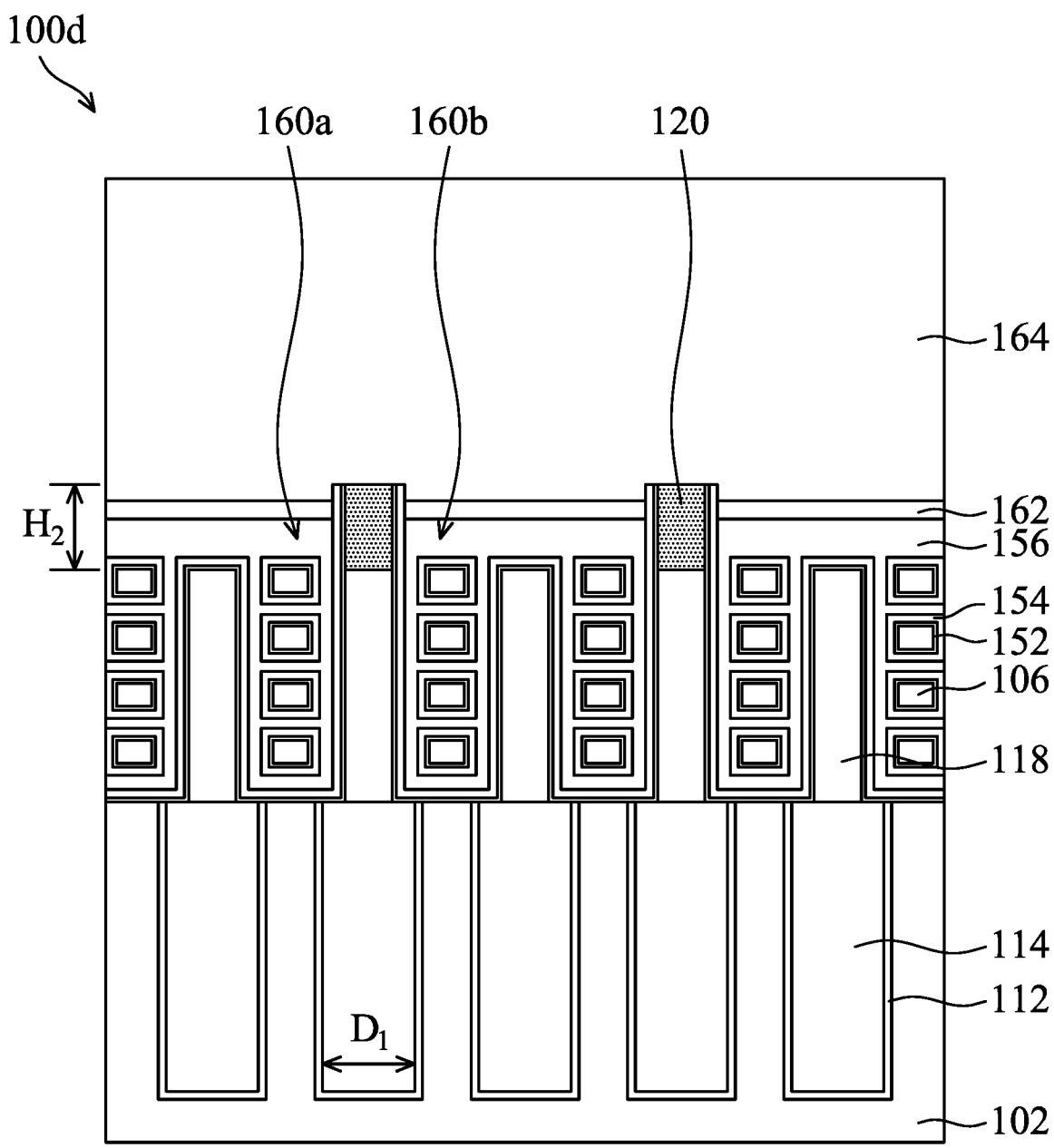

Next, as shown in FIG. 8E, the interfacial layer 152, the gate dielectric layer 154 and the gate electrode layer 156 are sequentially formed in the recess 149 and the gap 151, in accordance with some embodiments.

Next, a portion of the gate electrode layer 156 is removed, and therefore the top surface of the capping layer 120 is higher than the top surface of the gate electrode layer 156. As a result, the first gate structure 160a and the second gate structure 160b are separated by the dummy fin structure 118 and the capping layer 120.

Afterwards, the conductive layer 162 is selectively formed over the gate electrode layer 156, and the sacrificial layer 164 is formed over the conductive layer 162. The conductive layer 162 is used to reduce the resistance of the gate electrode layer 156.

The dummy fin structure 118 is a barrier structure between two adjacent S/D structures 138. As the dimensions of the fin structure 110 are gradually decreased, the width of the dummy fin structure 118 is gradually decreased. If the width of the dummy fin structure 118 is too small, the isolation effect of the dummy fin structure 118 may not be good enough. In addition, a first S/D contact structure (not shown) will be formed on the first S/D structures 138, but a distance of the first S/D contact structure and the second S/D structure (should be not electrically connected to the first S/D structure) become small since the width of the dummy fin structure 118 become small. The small distance may cause time dependent dielectric breakdown (TDDB). In order to prevent time dependent dielectric breakdown (TDDB), the second liner 117 is still left and is in direct contact with the S/D structure 138 to increase the distance between two adjacent S/D structures 138.

The dummy fin structure 118 and the capping layer 120 are used as the barrier structure of the first gate structure 160a and the second gate structure 160b. The dummy fin structure 118 and the capping layer 120 are formed before the formation of the gate structure 160, and therefore the self-aligned cut metal gate (SACMG) is formed to prevent the alignment issue. The dummy fin structure 118 and the capping layer 120 are made of different materials to have etching selectivity during the removal process.

Embodiments for forming a semiconductor device structure and method for formation the same are provided. The fin structures are formed above the substrate. The dummy fin structures are formed over the isolation structure and formed between two adjacent fin structures. A capping layer is formed over the dummy fin structures. A first gate structure and a second gate structure are formed over the fin structures, and are separated by the dummy fin structure and the capping layer. Since the dummy fin structure and the capping layer are formed before the formation of the first gate structure and the second gate structure, and therefore the self-aligned cut metal gate (SACMG) are formed. In addition, the distance between the first gate structure and the second gate structure is defined by the distance between two fin structures and is greatly reduced. The cut-metal gate process is self-aligned without alignment issued and the distance between two gate structures is reduced. Therefore, the yield of the semiconductor device structure is improved.

In some embodiments, a semiconductor device structure is provided. The semiconductor device structure includes an isolation structure formed over a substrate, and a first stacked wire structure and a second stacked wire structure extending above the isolation structure. The semiconductor device structure includes a dummy fin structure formed over the isolation structure, and the dummy fin structure is between the first stacked wire structure and the second stacked wire structure. The semiconductor device structure also includes a capping layer formed over the dummy fin structure. The isolation structure has a first width, the dummy fin structure has a second width, and the second width is smaller than the first width.

In some embodiments, a method for forming a semiconductor device structure is provided. The semiconductor device structure includes an isolation structure formed over a substrate, and a first stacked wire structure, a second stacked wire structure, and a third stacked wire structure extending above the isolation structure. The semiconductor device structure includes a first dummy fin structure formed over the isolation structure, and the first dummy fin structure is between the first stacked wire structure and the second stacked wire structure. The semiconductor device structure also includes a second dummy fin structure formed over the isolation structure, and the second dummy fin structure is between the second stacked wire structure and the third stacked wire structure. The semiconductor device structure further includes a capping layer formed over the second dummy fin structure. A first outer sidewall of the first stacked wire structure and a second outer sidewall of the second stacked wire structure are mirror image relative to the first dummy fin structure.

In some embodiments, a method for forming a semiconductor device structure is provided. The method includes forming a first stacked wire structure and a second stacked wire structure extending above an isolation structure. Each of the first stacked wire structure and the second stacked wire structure comprises a plurality of first semiconductor layers and a plurality of second semiconductor layers. The method also includes forming a first liner on a sidewall surface of the first stacked wire structure and a sidewall surface of the second stacked wire structure, and forming a dummy fin structure over the isolation structure. The dummy fin structure is between the first stacked wire structure and the second stacked wire structure, and the dummy fin structure has a width is smaller than a width of the isolation structure. The method further includes forming a capping layer over the dummy fin structure, and forming a dummy gate structure over the capping layer, the first stacked wire structure and the second stacked wire structure. A bottom surface of the dummy gate structure is higher than a top surface of the dummy fin structure. The method also includes forming a dielectric layer surrounding the dummy gate structure, and removing the dummy gate structure to form a trench in the dielectric layer. The method includes removing the first liner below the trench to form a first recess between the first stacked wire structure and the dummy fin structure, and a second recess between the second stacked wire structure and the dummy fin structure. The method includes removing the first semiconductor layers to form a gap between two adjacent second semiconductor layers, and forming a first gate structure in the first recess and the gap. The method further includes forming a second gate structure in the second recess and the gap. The first gate structure and the second gate structure are separated by the dummy fin structure and the capping layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   an isolation structure formed over a substrate;
   a first stacked wire structure and a second stacked wire structure extending above the isolation structure;
   a dummy fin structure formed over the isolation structure, wherein the dummy fin structure is between the first stacked wire structure and the second stacked wire structure; and
   a capping layer formed over the dummy fin structure, wherein the isolation structure has a first width, the dummy fin structure has a second width, and the second width is smaller than the first width.

2. The semiconductor device structure as claimed in claim 1, further comprising:
   a first gate structure formed over first stacked wire structure; and
   a second gate structure formed over the second stacked wire structure, wherein the first gate structure and the second gate structure are separated by the dummy fin structure and the capping layer.

3. The semiconductor device structure as claimed in claim 1, wherein a top surface of the capping layer is higher than a top surface of the first stacked wire structure and a top surface of the second stacked wire structure.

4. The semiconductor device structure as claimed in claim 1, wherein the dummy fin structure and the capping layer are made of different materials.

5. The semiconductor device structure as claimed in claim 1, wherein the dummy fin structure is made of low-k dielectric material, and the capping layer is made of high-k dielectric material.

6. The semiconductor device structure as claimed in claim 1, wherein an interface between the dummy fin structure and the capping layer is lower than a topmost surface of the first stacked wire structure.

7. The semiconductor device structure as claimed in claim 1, further comprising:
   an inner spacer layer formed on a sidewall surface of the first stacked wire structure, a sidewall surface of the second stacked wire structure, and a sidewall surface of the capping layer.

8. The semiconductor device structure as claimed in claim 1, wherein there is a first distance between an outer sidewall of the first stacked wire structure and a first sidewall of the dummy fin structure, there is a second distance between an outer sidewall of the second stacked wire structure and a second sidewall of the dummy fin structure, and the first distance is the same as the second distance.

9. The semiconductor device structure as claimed in claim 1, further comprising:
   a gate dielectric layer formed on sidewalls of the dummy fin structure.

10. The semiconductor device structure as claimed in claim 1, further comprising:
    a gate dielectric layer formed on sidewalls of capping layer, wherein the gate dielectric layer is not formed on a top surface of the capping layer.

11. The semiconductor device structure as claimed in claim 1, wherein an interface between the isolation structure and the dummy fin structure is lower than a bottommost surface of the first stacked wire structure.

12. A semiconductor device structure, comprising:
    an isolation structure formed over a substrate;
    a first stacked wire structure, a second stacked wire structure, and a third stacked wire structure extending above the isolation structure;
    a first dummy fin structure formed over the isolation structure, wherein the first dummy fin structure is between the first stacked wire structure and the second stacked wire structure; and
    a second dummy fin structure formed over the isolation structure, wherein the second dummy fin structure is between the second stacked wire structure and the third stacked wire structure; and
    a capping layer formed over the second dummy fin structure, wherein:
    a first outer sidewall of the first stacked wire structure and a second outer sidewall of the second stacked wire structure are mirror image relative to the first dummy fin structure.

13. The semiconductor device structure as claimed in claim 12, wherein the dummy fin structure is made of low-k dielectric material, and the capping layer is made of high-k dielectric material.

14. The semiconductor device structure as claimed in claim 12, wherein the first stacked wire structure comprises a plurality of wires, and a bottom surface of the capping layer is between a topmost surface of one of the wires and a bottommost surface of one of the wires.

15. The semiconductor device structure as claimed in claim 12, wherein an interface between the isolation structure and the dummy fin structure is lower than a bottommost surface of the first stacked wire structure.

16. The semiconductor device structure as claimed in claim 12, wherein the dummy fin structure has a U-shaped structure with a recessed middle portion.

17. A method for forming a semiconductor device structure, comprising:
   forming a first stacked wire structure and a second stacked wire structure extending above an isolation structure, wherein each of the first stacked wire structure and the second stacked wire structure comprises a plurality of first semiconductor layers and a plurality of second semiconductor layers;
   forming a first liner on a sidewall surface of a first stacked wire structure and a sidewall surface of a second stacked wire structure;
   forming a dummy fin structure over the isolation structure, wherein the dummy fin structure is between the first stacked wire structure and the second stacked structure, and the dummy fin structure has a width is smaller than a width of the isolation structure;
   forming a capping layer over the dummy fin structure;
   forming a dummy gate structure over the capping layer, the first stacked wire structure and the second stacked wire structure, wherein a bottom surface of the dummy gate structure is higher than a top surface of the dummy fin structure;
   forming a dielectric layer surrounding the dummy gate structure;
   removing the dummy gate structure to form a trench in the dielectric layer;
   removing the first liner below the trench to form a first recess between the first stacked wire structure and the dummy fin structure, and a second recess between the second stacked wire structure and the dummy fin structure;
   removing the first semiconductor layers to form a gap between two adjacent second semiconductor layers;
   forming a first gate structure in the first recess and the gap; and
   forming a second gate structure in the second recess and the gap, wherein the first gate structure and the second gate structure are separated by the dummy fin structure and the capping layer.

18. The method for forming the semiconductor device structure as claimed in claim 17, further comprising:
   removing a portion of the first semiconductor layers to form a cavity; and
   forming an inner spacer layer in the cavity, wherein the capping layer is surrounded by the inner spacer layer.

19. The method for forming the semiconductor device structure as claimed in claim 17, further comprising:
   forming a second liner over the first liner, wherein the second liner and the first liner are made of different materials.

20. The method for forming the semiconductor device structure as claimed in claim 17, further comprising:
   removing a portion of the first stacked wire structure and a portion of the second stacked wire structure to form a first S/D recess and a second S/D recess, respectively;
   forming a first S/D structure in the first S/D recess and forming a second S/D structure in the second S/D recess.

* * * * *